US012578655B2

(12) United States Patent
Meijerink et al.

(10) Patent No.: US 12,578,655 B2
(45) Date of Patent: Mar. 17, 2026

(54) SUB-FIELD CONTROL OF A LITHOGRAPHIC PROCESS AND ASSOCIATED APPARATUS

(71) Applicant: ASML NETHERLANDS B.V., Veldhoven (NL)

(72) Inventors: Rowin Meijerink, Valkenswaard (NL); Putra Saputra, Singapore (SG); Pieter Gerardus Jacobus Smorenberg, Rotterdam (NL); Theo Wilhelmus Maria Thijssen, Eindhoven (NL); Khalid Elbattay, Eindhoven (NL); Ma Su Su Hlaing, Eindhoven (NL); Paul Derwin, Eindhoven (NL); Bo Zhong, Mie (JP); Masaya Komatsu, Kamakura (JP)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 18/196,432

(22) Filed: May 12, 2023

(65) Prior Publication Data

US 2023/0288817 A1 Sep. 14, 2023

Related U.S. Application Data

(63) Continuation of application No. 17/441,353, filed as application No. PCT/EP2020/055890 on Mar. 5, 2020, now Pat. No. 11,662,666.

(30) Foreign Application Priority Data

Apr. 4, 2019 (EP) ...................................... 19167211
May 3, 2019 (EP) ...................................... 19172479
(Continued)

(51) Int. Cl.
G03F 7/00 (2006.01)

(52) U.S. Cl.
CPC ...... *G03F 7/70633* (2013.01); *G03F 7/70258* (2013.01); *G03F 7/70725* (2013.01)

(58) Field of Classification Search
CPC ............. G03F 7/70633; G03F 7/70258; G03F 7/70725; G03F 7/70616; G03F 1/70; G03F 7/706835; G03F 7/70525
See application file for complete search history.

(56) References Cited

U.S. PATENT DOCUMENTS 7,016,013 B2 3/2006 Van Der Biggelaar et al.
7,403,834 B2 7/2008 Poolla et al.
(Continued)

FOREIGN PATENT DOCUMENTS

EP 3343294 7/2018
EP 3547029 10/2019
(Continued)

OTHER PUBLICATIONS

Office Action issued in corresponding Chinese Patent Application No. 202080027012.7, dated Feb. 1, 2024.
(Continued)

*Primary Examiner* — Hung V Nguyen
(74) *Attorney, Agent, or Firm* — Pillsbury Winthrop Shaw Pittman, LLP

(57) ABSTRACT

A method for controlling a lithographic apparatus configured to pattern an exposure field on a substrate including at least a sub-field, the method including: obtaining an initial spatial profile associated with a spatial variation of a performance parameter associated with a layer on the substrate across at least the sub-field of the exposure field; and decomposing the initial spatial profile into at least a first component spatial profile for controlling a lithographic apparatus at a first spatial scale and a second component spatial profile for controlling the lithographic apparatus at a second spatial
(Continued)

scale associated with a size of the sub-field, wherein the decomposing includes co-optimizing the first and second component spatial profiles based on correcting the spatial variation of the performance parameter across the sub-field.

12 Claims, 10 Drawing Sheets

(30) Foreign Application Priority Data

| May 28, 2019 | (EP) | ..................................... | 19177106 |
| Aug. 20, 2019 | (EP) | ..................................... | 19192433 |

(56) References Cited

U.S. PATENT DOCUMENTS

| | | | |
|---|---|---|---|
| 8,717,536 | B2 | 5/2014 | Menchtchikov et al. |
| 11,048,174 | B2 | 6/2021 | Kubis et al. |
| 11,669,017 | B2 * | 6/2023 | Werkman ............ G03F 7/70525 |
| | | | 430/394 |
| 12,044,981 | B2 * | 7/2024 | Hauptmann ..... G05B 19/41875 |
| 2005/0151946 | A1 | 7/2005 | Van Der Biggelaar et al. |
| 2006/0033921 | A1 | 2/2006 | Den Boef et al. |
| 2006/0066855 | A1 | 3/2006 | Den Boef et al. |
| 2006/0285099 | A1 | 12/2006 | Sinke et al. |
| 2010/0201963 | A1 | 8/2010 | Cramer et al. |
| 2011/0027704 | A1 | 2/2011 | Cramer et al. |
| 2011/0043791 | A1 | 2/2011 | Smilde et al. |
| 2011/0102753 | A1 | 5/2011 | Van De Kerkhof et al. |
| 2011/0216294 | A1 | 9/2011 | Menchtchikov et al. |
| 2012/0008127 | A1 | 1/2012 | Tel et al. |
| 2012/0044470 | A1 | 2/2012 | Smilde et al. |
| 2012/0123581 | A1 | 5/2012 | Smilde et al. |
| 2013/0230797 | A1 | 9/2013 | Van Der Sanden et al. |
| 2013/0258310 | A1 | 10/2013 | Smilde et al. |
| 2013/0271740 | A1 | 10/2013 | Quintanilha |
| 2015/0170904 | A1 | 6/2015 | Tsen et al. |
| 2018/0292761 | A1 | 10/2018 | Cekli et al. |
| 2018/0307135 | A1 | 10/2018 | Ten Berge et al. |
| 2018/0314168 | A1 | 11/2018 | Van Haren et al. |

FOREIGN PATENT DOCUMENTS

| | | | |
|---|---|---|---|
| EP | 3680714 | | 7/2020 |
| JP | 2018508049 | | 3/2018 |
| KR | 20180104690 | | 9/2018 |
| KR | 102020117565 | | 10/2020 |
| ML | 4343-34 | * | 2/2003 |
| NL | 2021296 | | 9/2018 |
| TW | 200746343 | | 12/2007 |
| WO | 2009078708 | | 6/2009 |
| WO | 2009106279 | | 9/2009 |
| WO | 2013178422 | | 12/2013 |
| WO | 2016142169 | | 9/2016 |
| WO | 2016146217 | | 9/2016 |
| WO | 2017012859 | | 1/2017 |
| WO | 2017/144343 | | 8/2017 |
| WO | 2018121921 | | 7/2018 |
| WO | 2019029933 | | 2/2019 |

OTHER PUBLICATIONS

International Search Report and Written Opinion issued in corresponding PCT Patent Application No. PCT/EP2020/055890, dated Jun. 17, 2020.

Taiwanese Office Action issued in corresponding Taiwanese Patent Application No. 109111136, dated Feb. 5, 2021.

"Field size dependent lithographic machine adjustments," Research Disclosure, Database No. 496042 (Aug. 2005).

Jeong, I. et al.: "Scanner and etch co-optimized corrections for better overlay and CD control", Proc. of SPIE, vol. 10963 (2019).

Gorhad, K. et al.: "Co-optimization of RegC and TWINSCAN corrections to improve the intra-field on-product overlay performance", Proc. of SPIE, vol. 9778 (2016).

Office Action dated Oct. 28, 2022, issued in corresponding Japanese Patent Application No. 2021-558899, pp. 1-6.

Office Action issued in corresponding Korean Patent Application No. 10-2024-7000197, dated May 21, 2025.

* cited by examiner

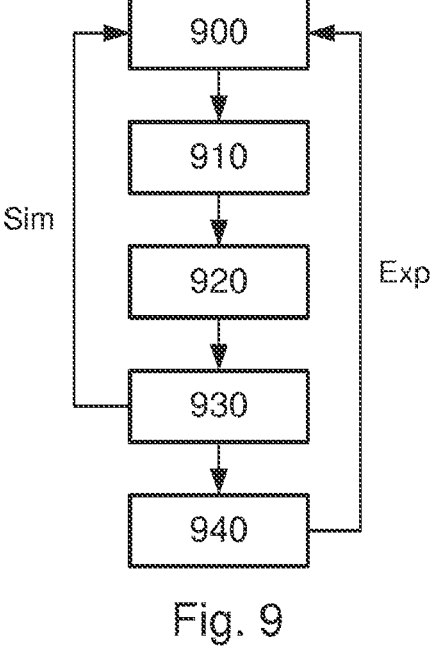
Fig. 9
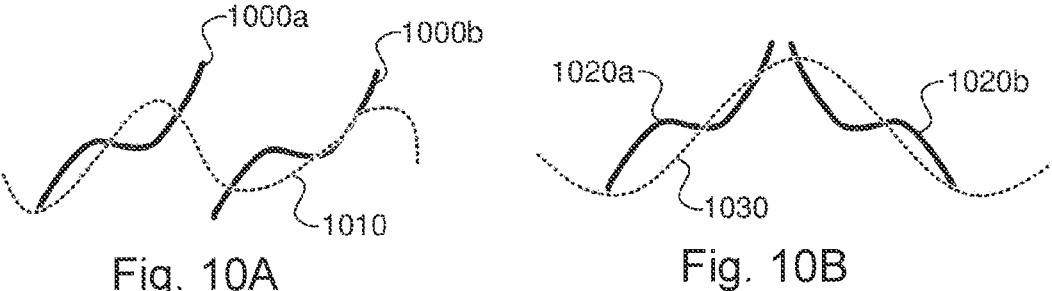
Fig. 10A                    Fig. 10B 1501
1502
1503
1504
1505
1506
1507

1550

1500

1511
1513
1515
1517

1550

1510

1520

1522

1524

1526

1550

1550

1600

1615

1610

1625

1620

1  2  3  4  5  6  7

SUB-FIELD CONTROL OF A LITHOGRAPHIC PROCESS AND ASSOCIATED APPARATUS

This application is a continuation of U.S. patent application Ser. No. 17/441,353, filed Sep. 21, 2021, which is the U.S. national phase entry of PCT Patent Application No. PCT/EP2020/055890, filed on Mar. 5, 2020, which claims the benefit of priority of European Patent Application No. 19167211.2, filed on Apr. 4, 2019, of European Patent Application No. 19172479.8, filed on May 3, 2019, of European Patent Application No. 19177106.2, filed on May 28, 2019 and of European Patent Application No. 19192433.1, filed on Aug. 20, 2019, each of the foregoing applications is incorporated herein in its entirety by reference.

FIELD

The present description relates to methods and apparatus for applying patterns to a substrate in a lithographic process and/or measuring said patterns.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth (CD) of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Examples of known scatterometers include angle-resolved scatterometers of the type described in US2006033921A1 and US2010201963A1. The targets used by such scatterometers are relatively large, e.g., 40 μm by 40 μm, gratings and the measurement beam generates a spot that is smaller than the grating (i.e., the grating is underfilled). In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications WO 2009/078708 and WO 2009/106279 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

Currently the overlay error is controlled and corrected by means of correction models described for example in US2013230797A1. Advanced process control techniques have been introduced in recent years and use measurements of metrology targets applied to substrates alongside the applied device pattern. These targets allow overlay to be measured using a high-throughput inspection apparatus such as a scatterometer, and the measurements can be used to generate corrections that are fed back into the lithographic apparatus when patterning subsequent substrates. Examples of advanced process control (APC) are described for example in US2012008127A1. The inspection apparatus may be separate from the lithographic apparatus. Within the lithographic apparatus wafer correction models are conventionally applied based on measurement of overlay targets provided on the substrate, the measurements being as a preliminary step of every patterning operation. The correction models nowadays include higher order models, to correct for non-linear distortions of the wafer. The correction models may also be expanded to take into account other measurements and/or calculated effects such as thermal deformation during a patterning operation While the use of higher order models may be able take into account more effects, however, such models may be of limited use, if the patterning apparatus itself does not provide control of corresponding parameters during patterning operations. Furthermore, even advanced correction models may not be sufficient or optimized to correct for certain overlay errors.

It would be desirable to improve such process control methods.

Beside the control of the higher order overlay errors it is also desirable to verify whether the control profile used by the lithographic apparatus does not cause any undesired dynamical effects potentially degrading pattern fidelity (e.g. geometrical accuracy). It is a subject of the invention to provide additional methods of control targeted to guarantee geometrical integrity of the patterning operation.

SUMMARY

In a first aspect of the invention, there is provided a method for controlling a lithographic process for exposing a pattern on an exposure field, the method comprising: obtaining an initial spatial profile associated with a spatial variation of a performance parameter for a first layer across a sub-field of the exposure field; decomposing the initial spatial profile into at least a first component spatial profile for controlling a lithographic apparatus to correct the spatial variation of the performance parameter and a second component spatial profile for controlling the lithographic apparatus or another apparatus to correct the spatial variation of the performance parameter; and co-optimizing the first and second component spatial profiles to achieve a better correction of the spatial variation of the performance parameter in comparison to correction of the spatial variation of the performance parameter based on using the initial spatial profile for controlling the lithographic apparatus.

In a second aspect of the invention, there is provided a computer program comprising program instructions operable to perform the method of the first aspect when run on a suitable apparatus.

In a third aspect of the invention, there is provided a method for determining an overlay correction profile, the method comprising: obtaining an overlay error profile between a first layer and a second layer across a sub-field within an exposure field; determining a first overlay correction profile for the first layer and a second overlay correction profile for the second layer, wherein the first and second correction profile sum up to mitigate the overlay error profile across the sub-field and are co-optimized to achieve a desired imaging quality across both the first layer and the second layer.

In a fourth aspect of the invention, there is provided a method for determining an overlay error correction, the method comprising: obtaining an overlay error profile extending across a plurality of sub-fields along a direction of scanning; and determining a reticle correction across at least two adjacent sub-fields out of the plurality of sub-fields, characterized in that the reticle correction is based on an expected improvement of the continuity of the overlay error profile between said adjacent sub-fields.

In a fifth aspect of the invention, there is provided a method to provide APC control input for an APC controller and sub-field control input for a lithographic apparatus, the method comprising: a) obtaining a fingerprint of a parameter measured across a substrate; b) decomposing the fingerprint into a global component and a sub-field component; c) using the global component and the sub-field component and control characteristics of the lithographic apparatus to determine a co-optimized control strategy; and d) determining the APC control input and sub-field control input based on the co-optimized control strategy.

In a sixth aspect of the invention, there is provided a method for determining an overlay error correction is disclosed, the method comprising: obtaining an overlay error profile extending across a plurality of sub-fields; and determining a reticle correction across at least two adjacent sub-fields out of the plurality of sub-fields, characterized in that the reticle correction is based on an expected improvement of the continuity of the overlay error profile between said adjacent sub-fields.

In a seventh aspect of the invention, there is provided a method is disclosed for co-optimized global and sub-field control strategy for a lithographic process comprising a) obtaining global and intra-die measurement data, b) decomposing the intra-die measurement data into global component data and sub-field component data, c) using the global component data, sub-field component data and known scanner control characteristics to determine the co-optimized control strategy, and d) provide a global control input and a sub-field control input based on the co-optimized control strategy.

In an eighth aspect of the invention, there is provided a method of configuring a process associated with manufacturing of semiconductor devices on a substrate, the method comprising: determining an expected variation of a ratio between dimensions of a feature provided to the substrate using a patterning process; and configuring the patterning process and/or a patterning device used in the patterning process to at least partially correct the expected variation of the ratio across a region on the substrate.

In a ninth aspect of the invention, there is provided a method of determining a sampling scheme associated with an exposure field on a substrate subject to a patterning process, the method comprising: deriving an expected distribution of a pattern dimensioning error and/or a pattern positioning error across the exposure field due to a time dependency of a synchronization error between movement of a patterning device and the substrate during the patterning process; and determining the sampling scheme based on a desired accuracy of characterizing the expected distribution using measurements of the pattern dimensions and/or pattern positions according to the sampling scheme.

In a tenth aspect of the invention, there is provided a method for controlling a lithographic apparatus configured to pattern an exposure field on a substrate comprising at least a sub-field, the method comprising: obtaining an initial spatial profile associated with a spatial variation of a performance parameter associated with a first layer on the substrate across at least the sub-field of the exposure field; and decomposing the initial spatial profile into at least a first component spatial profile for controlling a lithographic apparatus at a first spatial scale and a second component spatial profile for controlling the lithographic apparatus at a second spatial scale associated with a size of the sub-field, wherein the decomposing comprises co-optimizing the first and second component spatial profiles based on correcting the spatial variation of the performance parameter across the sub-field.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example, with reference to the accompanying drawings in which:

FIG. 9 is a flowchart describing a method according to an embodiment of the invention;

FIGS. 10A and 10B conceptually illustrate sub-field specific reticle corrections configured to diminish discontinuity of an overlay error across a boundary between sub-fields according to an embodiment of the invention;

FIGS. 12(*a*)-12(*c*) depict examples of how to assign global and intra-die fingerprint components to either the global or sub-field control infrastructure;

DETAILED DESCRIPTION

Before describing embodiments of the invention in detail, it is instructive to present an example environment in which embodiments of the present invention may be implemented.

Figure 1:
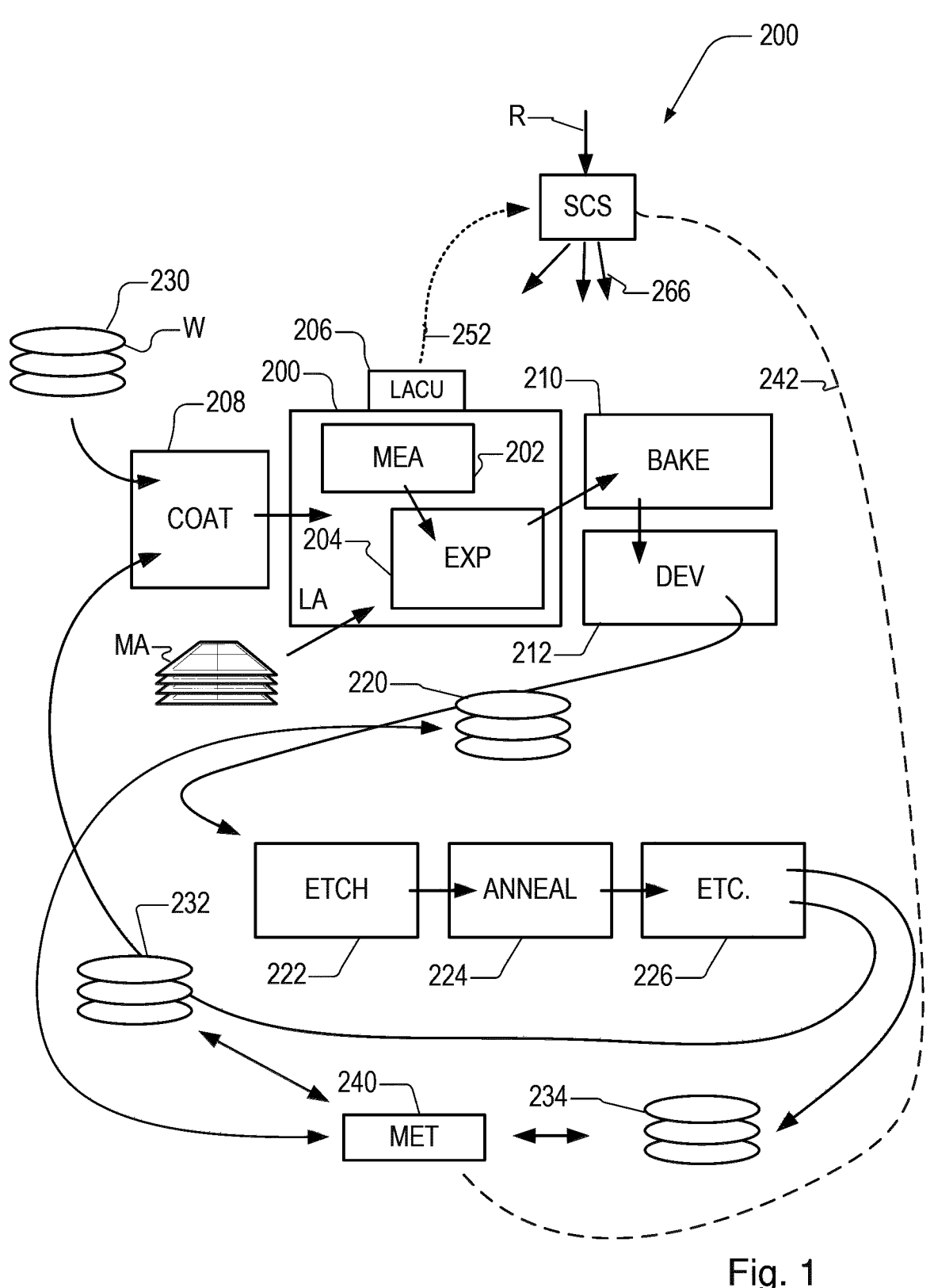
FIG. 1 depicts a lithographic apparatus together with other apparatuses forming a production facility for semiconductor devices.

FIG. 1 at 200 shows a lithographic apparatus LA as part of an industrial production facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables and two stations—an exposure station and a measurement station—between which the substrate tables can be exchanged.

Within the production facility, apparatus 200 forms part of a "litho cell" or "litho cluster" that contains also a coating apparatus 208 for applying photosensitive resist and other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses. As another example, apparatus and processing steps may be provided for the implementation of self-aligned multiple patterning, to produce multiple smaller features based on a precursor pattern laid down by the lithographic apparatus.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 240 which is provided for making measurements of parameters of the products at desired stages in the manufacturing process. A common example of a metrology station in a modern lithographic production facility is a scatterometer, for example a dark-field scatterometer, an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. The metrology results 242 from the apparatus 240 can be used to maintain accurate performance of the patterning operations in the litho cluster, by supervisory control system SCS and/or control unit LACU 206 making small adjustments over time, thereby minimizing the risk of products being made out-of-specification, and requiring re-work.

Additionally, metrology apparatus 240 and/or other metrology apparatuses (not shown) can be applied to measure properties of the processed substrates 232, 234, and incoming substrates 230. The metrology apparatus can be used on the processed substrate to determine important parameters such as overlay or CD.

Figure 2:
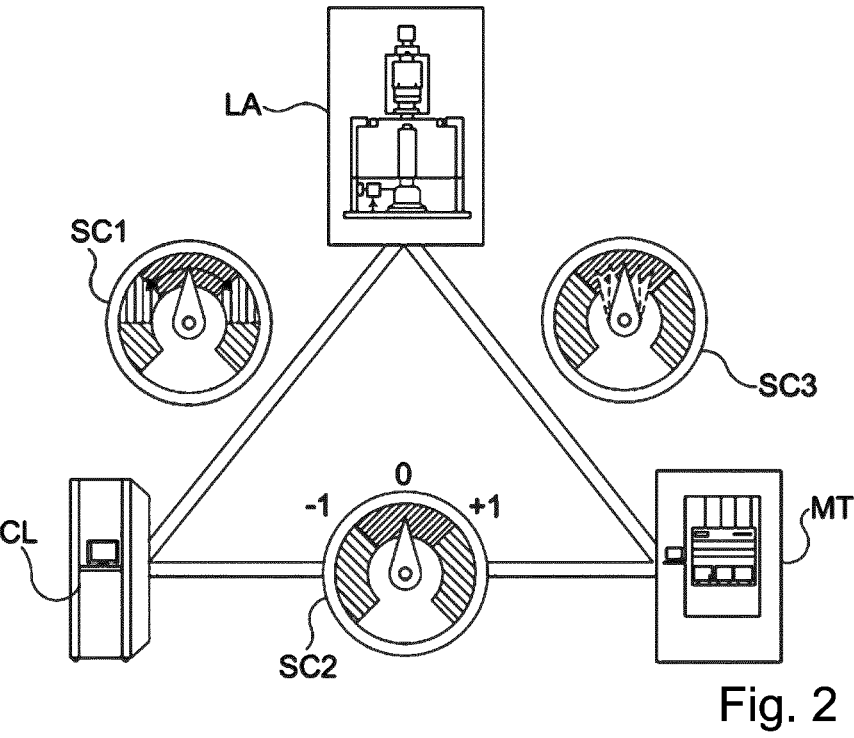
FIG. 2 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 2. One of these systems is the lithographic apparatus LA which is (virtually) connected to a metrology tool MET (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 2 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MET) to predict whether defects may be present due to e.g. sub-optimal processing (depicted in FIG. 2 by the arrow pointing "0" in the second scale SC2).

The metrology tool MET may provide input to the computer system CL to enable accurate simulations and predictions, and may provide feedback to the lithographic apparatus LA to identify possible drifts, e.g. in a calibration status of the lithographic apparatus LA (depicted in FIG. 2 by the multiple arrows in the third scale SC3).

Various techniques may be used to improve the accuracy of reproduction of patterns onto a substrate. Accurate reproduction of patterns onto a substrate is not the only concern in the production of ICs. Another concern is the yield, which generally measures how many functional devices a device manufacturer or a device manufacturing process can produce per substrate. Various approaches can be employed to enhance the yield. One such approach attempts to make the production of devices (e.g., imaging a portion of a design layout onto a substrate using a lithographic apparatus such as a scanner) more tolerant to perturbations of at least one of the processing parameters during processing a substrate, e.g., during imaging of a portion of a design layout onto a substrate using a lithographic apparatus. The concept of overlapping process window (OPW) is a useful tool for this approach. The production of devices (e.g., ICs) may include other steps such as substrate measurements before, after or during imaging, loading or unloading of the substrate, loading or unloading of a patterning device, positioning of a die underneath the projection optics before exposure, stepping from one die to another, etc. Further, various patterns on a patterning device may have different process windows (i.e., a space of processing parameters under which a pattern will be produced within specification). Examples of pattern specifications that relate to a potential systematic defect include checks for necking, line pull back, line thinning, CD, edge placement, overlapping, resist top loss, resist undercut and/or bridging. The process window of all or some (usually patterns within a particular area) of the patterns on a patterning device may be obtained by merging (e.g., overlapping) process windows of each individual pattern. The process window of these patterns is thus called an overlapping process window. The boundary of the OPW may contain boundaries of process windows of some of the individual patterns. In another words, these individual patterns limit the OPW. These individual patterns can be referred to as "hot spots" "critical features" or "process window limiting patterns (PWLPs)," which are used interchangeably herein. When controlling a lithography process, it is possible, and typically economical, to focus on the hot spots. When the hot spots are not defective, it is likely that all the patterns are not defective. The imaging becomes more tolerant to perturbations when values of the processing parameters are closer to the OPW if the values of the processing parameters are outside the OPW, or when the values of the processing parameters are farther away from the boundary of the OPW if the values of the processing parameters are inside the OPW.

Figure 3:
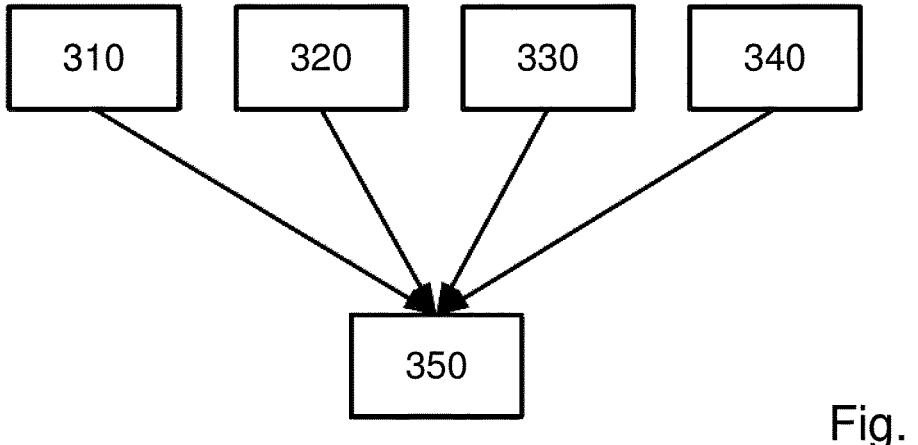
FIG. 3 shows exemplary sources of processing parameters.

FIG. 3 shows exemplary sources of processing parameters 350. One source may be data 310 of the processing apparatus, such as parameters of the source, projection optics, substrate stage, etc. of a lithography apparatus, of a track, etc. Another source may be data 320 from various substrate metrology tools, such as a substrate height map, a focus map, a critical dimension uniformity (CDU) map, etc. Data 320 may be obtained before the applicable substrate was subject to a step (e.g., development) that prevents reworking of the substrate. Another source may be data 330 from one or more patterning device metrology tools, patterning device CDU map, patterning device (e.g., mask) film stack parameter variation, etc. Yet another source may be data 340 from an operator of the processing apparatus.

Control of the lithographic process are typically based on measurements fed back or fed forward and then modelled using, for example interfield (across-substrate fingerprint) or intrafield (across-field fingerprint) models. United States Patent Application 20180292761, which is incorporated herein by reference, describes a control method for controlling a performance parameter such as overlay at a sub-field level using an advanced correction model. Another control method using sub-field control is described in European Patent Application EP3343294A1, which is also incorporated herein by reference.

However, while an advanced correction model may, for example, include 20-30 parameters, lithographic apparatuses (the term "scanners" will be used throughout the description for brevity) currently in use may not have actuators which correspond to one or more of the parameters. Hence, only a subset of the entire set of parameters of the model can be used at any given time. Additionally, as the advanced models require many measurements, it is not desirable to use these models in all situations, since the time required to perform the necessary measurements reduces throughput.

Some of the main contributors to overlay errors include, but are not limited to, the following:

scanner-specific errors: these may arise from the various subsystems of the scanner used during exposure of the substrate, in effect creating a scanner-specific fingerprint;

process induced wafer deformation: the various processes performed on the substrates may deform the substrate or wafer;

illumination setting differences: these are caused by the settings of the illumination system, such as the shape of the aperture, lens actuator positioning, etc.;

heating effects—heating induced effects will differ between various sub-fields of a substrate, in particular for substrates wherein the various sub-fields include different types of components or structures;

reticle writing errors: errors may be present already in the patterning device due to limitations in its manufacture; and topography variations: substrates may have topography (height) variations, in particular around the edges of wafers.

Modeling overlay error of individual sub-fields of a field (e.g., at die level or other functional area level) can be carried out instead of modeling the overlay error of the field in its entirety, or it can be modeled in addition to modeling the field in its entirety. While the latter requires more processing time, since both the field as well as the sub-fields within it are modeled, it allows for the correction of error sources which relate to a particular sub-field only as well as error sources which relate to the entirety of the field. Other combinations, such as modeling the entire field and only certain sub-fields, are of course possible.

Even where an error is modelled sufficiently, actuation of a resultant correction also presents difficulties. Some corrections simply cannot be actuated effectively using the available control parameters (control knobs). Additionally, while other corrections may be actuatable, actually doing so may result in undesirable side effects. Essentially, due to dynamic and control limitations and sensitivities, there is a limit on what the scanner can actually do to implement a correction.

Figure 4:
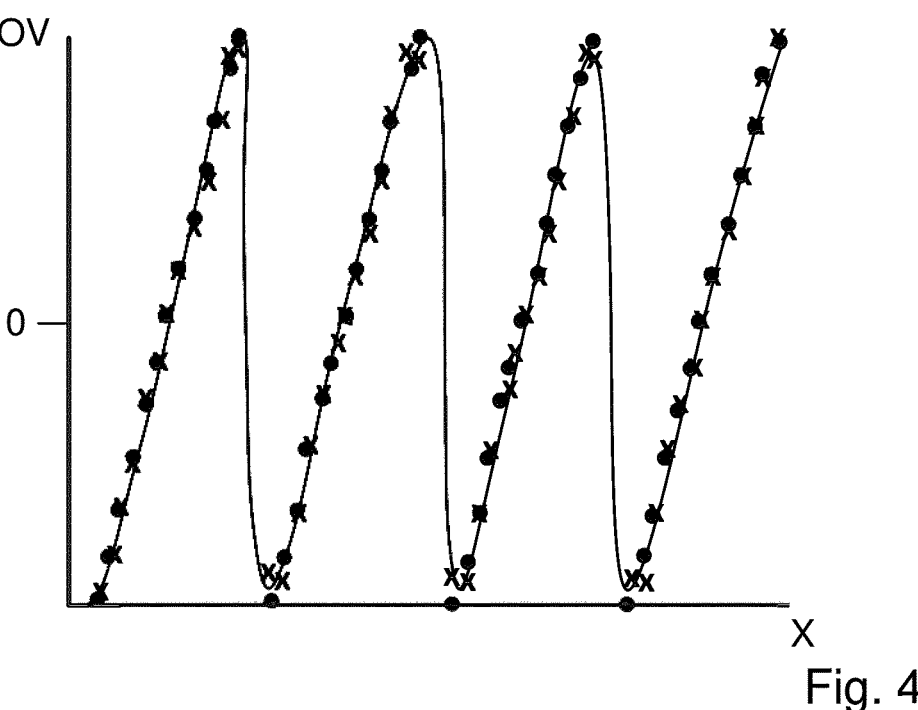
FIG. 4 is a graph of overlay against field position, showing measured overlay; and a fitted correction modeled and/or implemented using a control grid determined by a method according to an embodiment of the invention.

FIG. 4 illustrates a specific example of an inter-field overlay fingerprint which presents difficulty in actuating correction. It shows a graph of overlay OV (y-axis) against direction X (or Y). Each cross represents a measured overlay value, and each dot is a necessary corresponding compensating correction. The fitted line is a (near ideal) correction profile, which is fitted to the corrections (dots). The saw tooth pattern exhibited in the overlay fingerprint is evident; each section through which the overlay varies substantially linearly with X being a single die (the graph representing overlay measurements across 4 dies). The correction profile follows (and therefore compensates for) the overlay fingerprint. Such a fingerprint is seen as a result of the large stresses induced by a large stack, e.g., as used in a 3D-NAND or DRAM process for example. This stress manifests itself both at wafer level (causing severe wafer warp) as well as at die level. At die level, the overlay fingerprint comprises a magnification inside each die. Since there are multiple dies within an exposure field, the resultant field overlay fingerprint exhibits the sawtooth pattern shown (typically at a scale of tens of nm). Depending on the orientation of the device, the pattern can either be through-slit or through-scan. Regardless of the orientation, the overlay cannot be corrected with available models and actuators. In particular, actuation of a correction for such an extreme pattern is not possible within the scanner alone.

While the embodiments herein will be described specifically in terms of overlay or edge placement error (EPE) which manifests as a sawtooth pattern (e.g., caused by intra-die stress in the 3D-NAND or DRAM process, as illustrated in FIG. 4), it should be appreciated that it can be used to correct any other higher-order overlay, EPE or focus fingerprint.

In order to optimally correct the overlay fingerprint as depicted in FIG. 4 it is important to be able to adjust the scanner at a spatial scale which is smaller than the pitch of a periodic profile, for example smaller than one "saw tooth' of the repeating saw tooth profile of FIG. 4. Such an individual saw tooth area is typically associated with a cell structure within an individual die. Hence the interface to the scanner should allow the definition of separately controllable areas within an exposure field. This concept is referred to as a sub-field control interface; an example of this disclosed in the aforementioned European Patent Application EP3343294A1. For example the control profile for the wafer stage of the scanner configured for a first cell die/cell structure may be defined largely independently from a control profile for a second cell/die structure positioned further along a direction of scanning. The sub-field control infrastructure allows a more optimal correction of overlay (or focus) variations being repetitive at a sub-field resolution. Further the ability to independently control different sub-field areas allows mitigation of die-to-die or cell-to-cell variations of the intra-die and/or intra-cell overlay/focus fingerprint.

Typically scanner overlay control uses dynamic stage position control to adjust placement of structures (features) such that an overlay error is minimized. In principle this may be implemented by pre-correction of an expected overlay error fingerprint (e.g., as induced by a buildup of stress due to application of a subsequent layer) and/or by adjustment of placement of features within the subsequent layer in order to sufficiently align with features in the previous layer(s).

An example technique for pre-correcting placement errors, such as those induced by stress, is to adjust feature placement within a cell and/or die on the reticle. This may be done, for example, during the reticle manufacturing step and/or a reticle correction step. More specifically, control of the e-beam of a reticle write tool can be adjusted such that features are shifted with respect to a nominal position. Ideally the shift would be exactly the opposite of the error shift being corrected, e.g., the feature shift due to stress induced deformation after application of the subsequent layer. The effect is that the use of such a reticle would leave much less to be corrected by the scanner overlay correction infrastructure. However, correction via the reticle is necessarily static and cannot address any variation (e.g., field-to-field, wafer-to-wafer and/or lot-to-lot variation) in the overlay fingerprint. Such variation can be of the same order of magnitude as the fingerprint itself. In addition, there are actuation and sensitivity limitations in controlling such a reticle writing correction inherent in the writing tool used (e.g., an e-beam tool or similar).

The scanner overlay correction is typically applied by the stage controller and/or lens manipulators of the projection lens (odd aberration control may be used to control placement of features). However, as already mentioned, the scanner cannot perfectly follow any desired overlay correction profile. One reason for this is due to constraints on the speed and acceleration achievable by the wafer (and reticle) stage. Another reason is the fact that the scanner exposes the substrate with a relatively large illumination spot (the so-called slit length being representative for the size of the light spot in the scanning direction, reference: EP application EP19150960.3, which is hereby incorporated by reference in its entirety). The extension of the light spot means that some part of the features within a die/cell will always be sub-optimally positioned during the scanning exposure, in situations where the desired overlay correction is not merely a simple shift across the entire die/cell. This variation of the effective position (overlay) correction during the scanning operation effectively causes a blurring of the aerial image of the features, which in turn leads to a loss of contrast. This dynamic effect is commonly referred to as Moving Standard Deviation (MSD). The limitations on the stage positioning are typically associated with the average position (overlay) error and are commonly referred to as a Moving Average (MA) error.

More specifically, the Moving Average (MA) error and Moving Standard Deviation (MSD) of the error of a lithographic stage relates to a critical time window comprising the time interval that each point on a die is exposed (in other words: receives photons). If the average position error for a point on the die during this time interval is high (in other words: high MA-error), the effect is a shift of the exposed image, resulting in overlay errors. If the standard deviation of the position error during this time interval is high (in other words: high MSD error), the image may smear, resulting in fading errors.

Both average overlay errors (MA) and contrast loss due to MSD are contributors to the overall Edge Placement Error (EPE) budget and hence need to be carefully balanced when determining a certain control profile for a wafer and/or reticle stage, typically a more MA targeted control approach will give a higher MSD impact, while an MSD targeted control strategy may lead to unacceptably large MA errors. EPE is the combined error resultant from global critical dimension uniformity (CDU), local CDU (e.g., line edge roughness LER/line width roughness LWR) and overlay error. It is these parameters which have the greatest effect on yield, as it is errors in these parameters which effect the relative positioning of features, and whether any two features unintentionally make contact or unintentionally fail to make contact.

The present reticle correction is implemented without consideration of the scanner capabilities (or even proper consideration of the reticle writing tool sensitivities/capabilities). This is followed by a subsequent exposure control optimization devised within the scanner, by which time the reticle correction is fixed. In a proposed method, a reticle optimization and an exposure control optimization is performed together to achieve improved performance according to a performance metric such as overlay, focus, CDU or EPE. As such, it is proposed to balance control of the reticle formation process (e.g., a writing, correction or alteration process) with control of the scanner exposure process (e.g., overlay control). In particular, a co-optimization of control within these two control regimes is proposed.

For example, the co-optimization of correction strategies for both of the reticle formation process and scanner exposure process may determine an optimized reticle correction which is such that that the co-optimized scanner correction corrects for a simpler to actuate overlay error profile in the scanning direction. The co-optimization may also take into account reticle writing tool capabilities and/or sensitivities to better optimize the reticle correction. Further it is proposed, in an embodiment, to co-optimize numerous components/processes of the IC manufacturing process and interactions therebetween, to obtain optimal desired performance in respect to one or multiple performance parameters. Where multiple parameters are considered, they may be weighted by relevance.

In an embodiment, the reticle correction may be determined as a linear or step correction, and the scanner exposure correction a higher order (e.g., $3^{rd}$ order or greater) correction. This enables the latter to be a smaller correction (e.g., lower in amplitude), requiring less extreme movements of the stage(s) which is therefore easier to actuate within the scanner.

Figure 5:
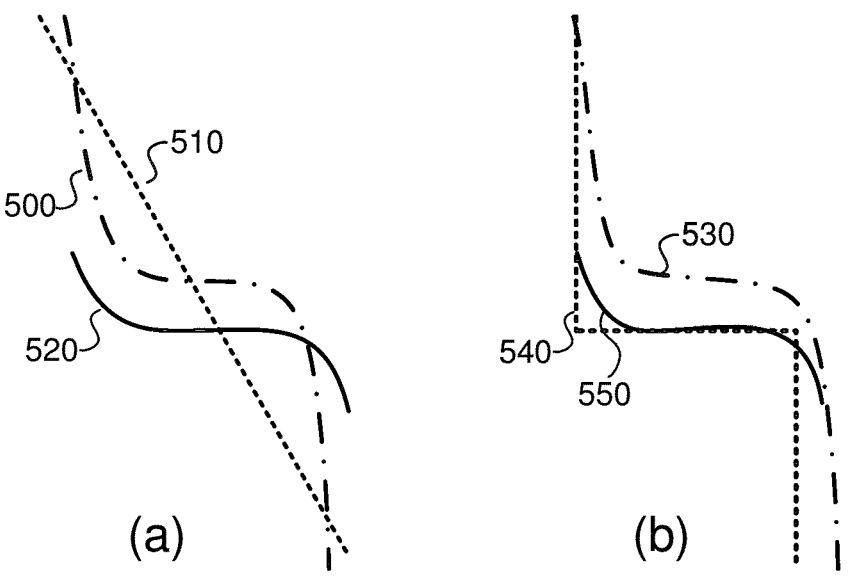
FIG. 5 conceptually illustrates two examples of decomposition of a control profile according to a first main embodiment of the invention.

FIG. 5 conceptually illustrates such a method. FIG. 5(a) depicts a desired correction 500 (dot-dash line) representing a "total correction" (initial spatial profile) across a sub-field, e.g., the total correction profile required to correct for an expected overlay residual for a die. According to concepts disclosed herein, the desired correction 500 is decomposed into component spatial profiles including a reticle sub-field correction 510 component (linear component-dotted line) and a higher order (but smaller amplitude) scanner sub-field component 520 (solid line) which is more optimally correctable by the scanner overlay correction infrastructure (e.g. stage and/or projection lens control).

It may be that, when using a linear reticle correction, it may not always be possible to correct the total intra-die stress fingerprint, or it can be too easy to over-correct using a linear correction. Therefore, FIG. 5(b) illustrates an alternative strategy using a step function correction for the reticle sub-field correction. Shown is the desired correction 530 (dot-dash line) decomposed into component spatial profiles including the step function reticle sub-field correction 540 component (dotted line) and higher order scanner sub-field component 550 (solid line). This step function helps to pull the edges of the higher order shape (sub-field component 550) to obtain a better correction.

The reticle sub-field correction may be implemented as a control recipe for a reticle writing tool, for a reticle correction tool or other tool used in the manufacture, correction or alteration of a reticle. In another embodiment, instead of (or in addition to) applying a permanent reticle writing modification (correction) during a reticle manufacturing step, a post-reticle manufacturing overlay correction may be applied to the reticle based on femto-second laser pulse technique. Such a concept is described in US patent application US 20180307135, which is hereby incorporated by reference in its entirety.

More generally, the desired total correction profile may be decomposed into various components (e.g., high order, low order, and scaling components) with these components being assigned optimally to either scanner control or reticle manufacture/correction control to achieve the best possible correction resulting in the lowest on-product overlay residual.

Figures 6, 7:
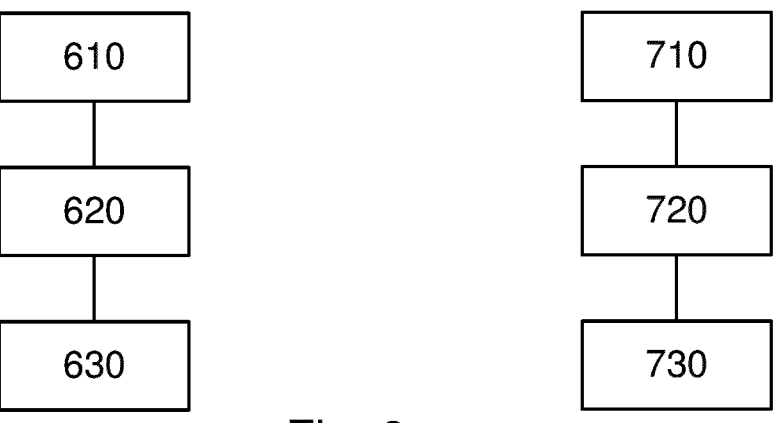
FIG. 6 is a flowchart describing a method according to an embodiment of the invention.
FIG. 7 is a flowchart describing a method according to an embodiment of the invention.

FIG. 6 is a flowchart describing an embodiment of the concepts disclosed herein. At step 610, a desired total correction profile (initial spatial profile) is obtained, which represents an overlay error profile along a scanning direction which is to be corrected. This may be derived, for example, from an expected or known intra-die stress fingerprint. At step 620, the total correction profile is decomposed into a plurality of candidate scanner sub-field correction profiles (candidate first component spatial profiles) and candidate reticle sub-field correction profiles (candidate second component spatial profiles). At step 630, an optimal combination of reticle sub-field correction profiles and scanner sub-field correction profiles is chosen according to a performance metric, e.g., the combination which results in the smallest overlay residual over the field.

FIG. 7 shows a variation of the method of FIG. 6, based on a merit function. Step 710 is the same as step 610. Step 720 may comprise devising a merit function which describes a performance parameter in terms of one or more reticle sub-field correction terms (e.g., a low order or linear part of the desired total correction) and one or more scanner sub-field correction terms (e.g., a higher order part of the desired total correction). In an embodiment, the scanner sub-field correction terms may be constrained within a (e.g., relatively) small range to make it easier to actuate within the scanner, with the reticle sub-field correction terms allowed to have a larger magnitude. A small range in this context may comprise 50%, 40%, 30%, 20% or 10% of the magnitude of the desired total correction profile. Step 730 then comprises optimizing the merit function in terms of the performance parameter. This may comprises, for example, solving an iterative algorithm which optimizes (e.g., minimizes) the performance parameter value (e.g., overlay or EPE).

The co-optimized scanner correction profile may undergo a further optimization within the scanner, e.g., based on scanner metrology (alignment/leveling etc.) or other metrology to determine the actual correction profile implemented during exposure.

The balancing between reticle correction and scanner correction may be further refined by including an optimization of MA or MSD or MA/MSD combination associated with the scanner correction profile with respect to a suitable performance parameter (e.g., an expected EPE error of one or more critical features). In such an embodiment, the method may comprise identifying one or more critical features within the sub-fields and performing the either of the methods of FIG. 6 or 7 in terms of minimizing expected EPE of the critical feature(s) and/or using EPE of the critical feature(s) as the merit term/performance parameter in the merit function.

In further embodiments, the co-optimization step may take into account (e.g., co-optimize) control parameters other than stage/projection lens control profiles in the scanning direction, which effect the performance parameter. For example, the co-optimized scanner control profile may be further optimized in terms of focus, dose etc., all of which also have an effect on EPE.

Alternatively, or in addition to dividing a correction profile into control profiles for different tools (scanner and reticle write tool), a correction profile may also be distributed across a plurality of layers applied to the substrate.

In such an embodiment, a correction profile associated with a sub-field of an exposure field may be decomposed into fractional components thereof, for separate actuation in different layers on a substrate. Decomposing a correction profile in this manner, and applying the fractional components in different layers can enable determination of fractional components which are simpler to actuate within the scanner and/or on a reticle. As such, a proposed total correction profile to be implemented in exposure of a first layer may be decomposed into complementary multiple control profiles for implementation in multiple layers. For example, a proposed total correction profile to be implemented in exposure of a first layer may be decomposed into complementary first and second control profiles to be implemented in exposure of the first layer and a second layer respectively.

This embodiment may be realized separately to the previously described embodiment, such that the total correction profile is divided into at least first and second correction profiles for the scanner. The scanner will then implement the first and second correction profiles when exposing different layers on a substrate. In another embodiment, the first and second correction profiles may be configured as control recipes for reticle correction (e.g., a reticle writing/correction tool). In the latter case the first correction is configured for a first reticle associated with a first layer and the second correction is configured for a second reticle associated with a second layer.

The concepts of assigning correction components to different layers and to reticle and scanner correction may be combined. This can be achieved by any suitable method. For example, the reticle and scanner corrections can be co-optimized initially (e.g., using the methods described in FIG. 6 or 7), with one or both of the reticle and scanner corrections then be further decomposed to be distributed over two or more layers. Alternatively, the layer distribution may be performed first based on the total correction to determine layer correction profiles, with each of the layer correction profiles then being decomposed into reticle corrections and scanner corrections. Alternatively, the co-optimization may simultaneously co-optimize decomposition of a total correction profile relating to a single layer into component reticle and scanner correction profiles for two or more layers (e.g., using a suitable merit function).

In all the above examples, the optimization may be performed in terms of any of the performance parameters already disclosed (overlay, EPE etc.). In an embodiment the performance parameter error is associated with stress induced by application of the subsequent layer, with the co-optimization being based on an expected performance parameter residual. The description will continue to describe this embodiment in terms of distribution of a control profile between two layers. In all cases, where applicable, the distribution of a control profile may be between more than two layers.

Figure 8:
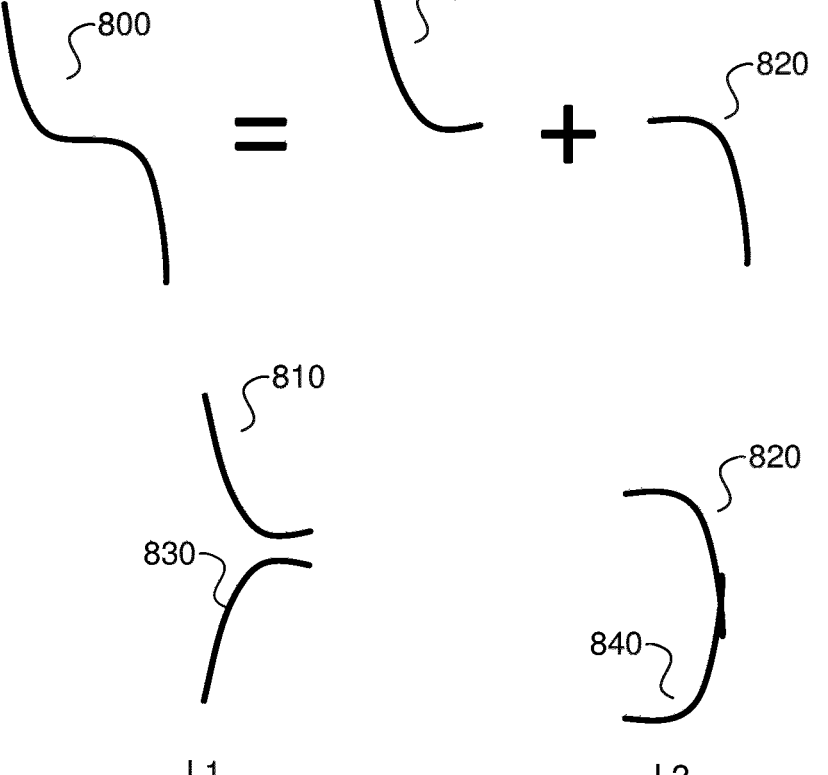
FIG. 8 conceptually illustrates decomposition of a control profile according to a second main embodiment of the invention.

FIG. 8 depicts the decomposition of an overlay error profile 800 across a sub-field into a first layer component 810 and a second layer component 820. Effective correction of such an overlay profile may be achieved by defining a first layer overlay correction 830 for a first layer L1 and a second layer correction 840 for a second layer L2, subsequent to the first layer L1.

Typically the total correction profile is divided such that: a) the first correction and second correction together sum up to the desired total overlay correction and b) the first and second correction can be implemented using respectively first and second control profiles which can be followed more accurately using the control infrastructure of the scanner. The first and second control profiles, for example, may be constrained or maintained to be within a smaller range than the total control profile.

In an embodiment, the first and second layer control profiles may be balanced such that a) the MSD characteristics associated with the first and second layer control profile do not unduly deteriorate imaging quality of features within the first layer and the second layer and b) the MA characteristics associated with the first and second layer control profiles do not unduly deteriorate overlay between the first layer and the second layer. Hence a total desired overlay correction may be split into a plurality of per-layer control profiles that are balanced to ensure that per-layer EPE (MSD driven, representative for imaging quality) is acceptable and overlay between the layers remains within specification (MA driven). This can be done on the basis of overall acceptability (best ratio) or alternatively to obtain better correction in one layer (e.g., a critical layer) at the expense of another (e.g., less critical) layer.

This balancing can be realized by determining the maximum allowed MSD degradation, and using this to optimize scanner illumination settings. This may be done as part of a Multi Focus Imaging (MFI) operational mode. The optimized scanner illumination settings may be such that they enable an optimal intra-die stress correction while maintaining an acceptable (e.g., practical) process window.

MFI uses multiple focus levels (e.g., via multiple wavelengths) to effectively increase depth of focus (DoF) for a given numerical aperture (NA) of the objective lens. This enables the imaging NA, and therefore exposure latitude (process window), to be increased while the DoF can be optimized by MFI in accordance with production layer needs.

One issue with sub-field control as described herein is that it tends to increase MSD. Using an MFI optimization, in this context, allows more room for MSD degradation, therefore enabling a corresponding relaxation of any MSD constraint. For example, one approach for decomposing the total control profile may comprise performing any of the methods described above in terms of the process parameter, particularly overlay (i.e., MA), with MSD applied as a constraint (e.g., constrained within an allowable range). By optimizing illumination via MFI to increase DoF and the process window, the MSD constraint can be relaxed. Relaxation of the MSD constraint increases the correction space available for the MA/overlay correction profiles, effectively allowing more extreme movements of the stage.

FIG. 9 is a flowchart illustrating the proposed approach for each layer. At step 900, the intra-die stress performance parameter (e.g., overlay) fingerprint is measured and decomposed according into layer scanner control components for application in two or more different layers (this method may also be applicable for the scanner component of the first described embodiment with decomposition per tool). At step 910, the maximum allowed MSD is determined per-layer based on the layer characteristics (typically, every layer has a different sensitivity to MSD) and, based on this, the illumination conditions are optimized 920 for exposing that layer. This may be achieved via control of the scanner and/or laser (illumination source). At step 930, based on the decomposed layer control profile and optimized illumination conditions for each layer, an improved optimized scanner control profile is determined for the layer. This may be fed back SIM in a simulation based loop. Finally, at step 940, actual on-product performance may be verified (e.g., via metrology) and fed back EXP in an experimental based loop.

In this manner, it is possible to extend the correction range of overlay (or other parameter of interest) subfield corrections by increasing the application process window, therefore allowing for a higher MSD limit. Such an optimization may be performed per layer.

FIG. 8 and corresponding paragraphs in this document describe a method to divide a correction profile into a plurality of components; each component associated with a specific layer and the sum of the components adding up to a desired control profile. The problem with such an approach may be that variability (instability) of processing steps performed between the patterning of a first layer and a subsequent second layer may prevent an effective (accurate enough) determination of a first component of the correction profile associated with the first layer. Any decomposition choice made may be prone to undesired performance decrease in case said (intermediate) processing step (for example deposition, etching, CMP and the like) causes an unexpectedly large or small in-plane distortion profile across the dies (corresponding for example to sub-fields) on the substrate.

Figures 15A, 15B:
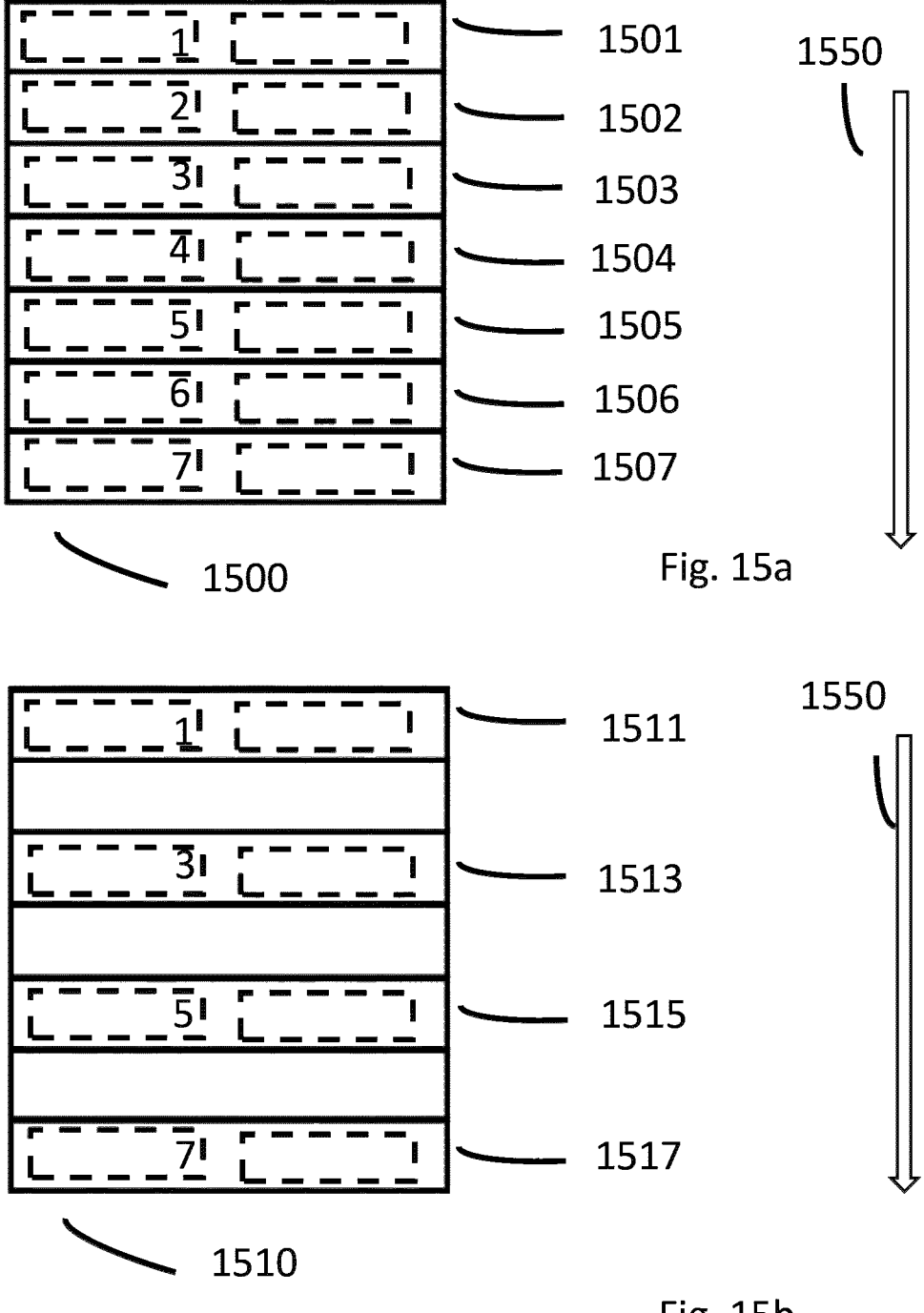
FIGS. 15(*a*)-15(*c*) depict examples of distributing sub-fields across a reticle among two reticles.
Figures 15C, 16:
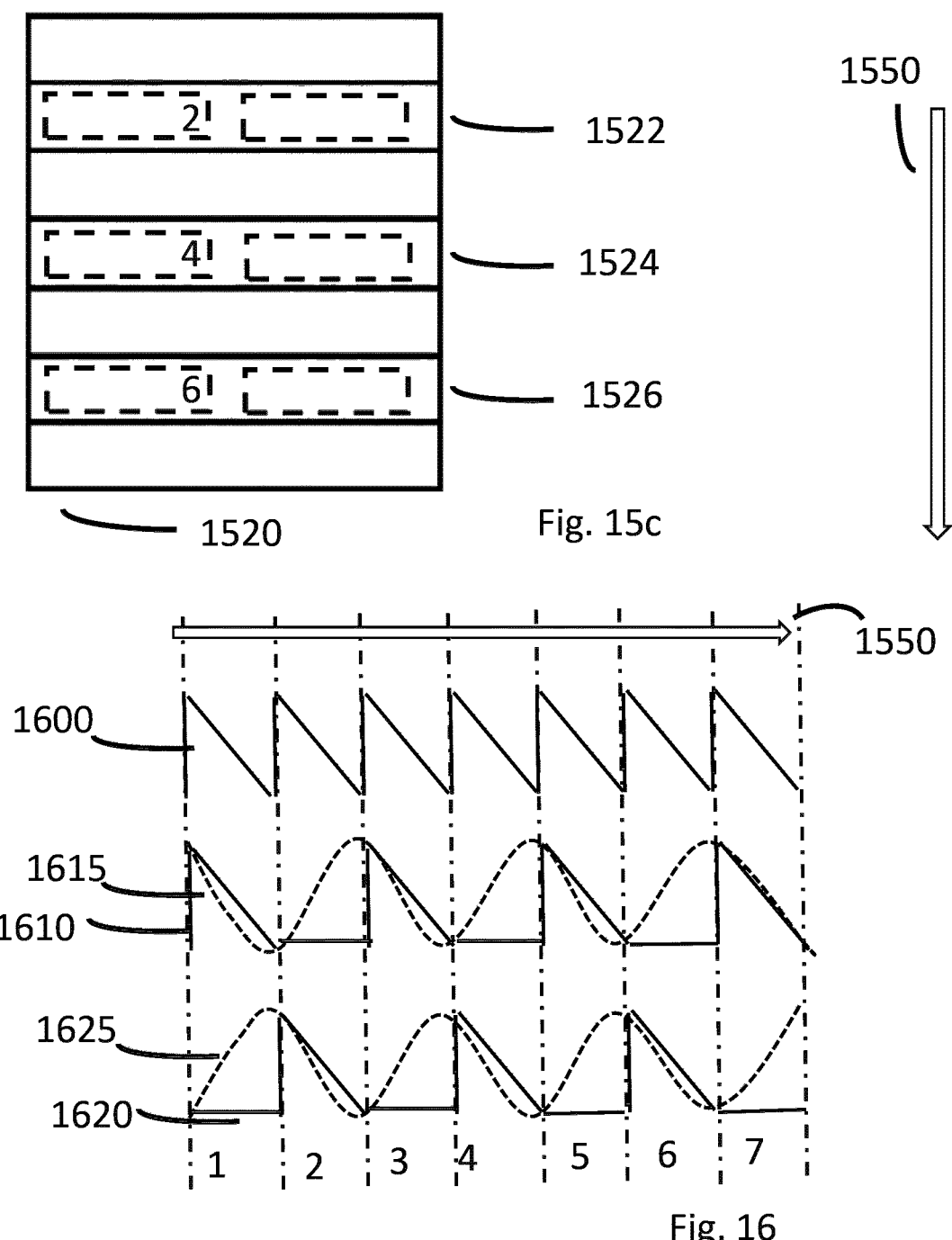
FIG. 16 depicts control profiles associated with the distributions of sub-fields as displayed in FIGS. 15(*a*)-15(*c*)

To overcome this problem it is proposed to utilize a double exposure technique wherein a first group of dies (corresponding to a group of sub-fields) are exposed in a first exposure and a second group of dies (sub-fields) in a second exposure. Typically the exposed dies are provided to a single layer on the substrate. Typically each group of dies is associated with a different patterning device (e.g. mask, reticle). FIG. 15*a,b,c* depict a grouping of sub-fields and their corresponding dies and their distribution across (in this case 2) reticles. FIG. 15*a* depicts an exposure field 1500 covering a reticle area having provided 14 dies (dotted line rectangles). The exposure field 1500 is divided into 7 sub-fields 1501-1507. FIG. 15*b* depicts a first group of sub-fields {1511, 1512, 1515, 1517} configured to expose 4 rows of oddly numbered dies {1, 3, 5, 7} on a first reticle 1510. FIG. 15*c* depicts the second group of sub-fields {1522, 1524, 1526} on a second reticle 1520 configured to expose the evenly numbered dies {2, 4, 6}. By grouping the dies into a first group comprising the oddly numbered dies and a second group of the evenly numbered dies, and providing these groups to separate reticles the distance between the sub-fields (and dies) along a direction of scanning 1550 is increased at least by the length (dimension along the direction of scanning 1550) of a sub-field. The lithographic tool may for example expose first one or more substrates after loading the first reticle and consequently exposing the first group of dies to the substrate(s) and in a second exposure step (after loading the second reticle) expose the second group of dies to the already exposed substrate(s).

The main advantage is that the lithographic tool has to apply (per exposure step) a considerably less spatially fluctuating control profile. Such a lower frequency control profile is better suited for accurate implementation by the stage and lens actuators available within the lithographic tool. This is depicted in FIG. 16. A first (initial) control profile is associated with a performance parameter variation 1600 along a direction of scanning 1550 and all subfields 1-7 (separated by dotted lines). The initial control profile (first control profile) must be able to sufficiently accurately follow the continuous line 1600 representing for example a typical saw tooth shaped (overlay) variation. If the parameter variation 1600 is to be corrected/controlled in a single exposure the lithographic tool actuators need to provide control (overlay for example) at a first spatial frequency 'f1'. If a double exposure approach is adopted a first control profile component 1615 (dashed line) may be applied to correct the performance parameter variation 1610 (continuous line representing a lower pitch saw tooth) across the first group of sub-fields (1,3,5,7), the first control profile (component) applied during the first exposure step. Flat lines comprised within the continuous line 1610 between the triangle shaped peaks means basically a 'don't care' or significantly reduced control requirement applies; the actuators may behave in any manner in order to prepare for actuation during the next relevant sub-field. The actuators in the second exposure step may then be configured to correct or mitigate the performance parameter variation 1620 (continuous line), corresponding to a second control component profile 1625 (dashed line). The resulting control profile (summation of the first and second control profile components) effectively accomplishes correction/control of the performance parameter variation 1600. The first and second control profile components are then associated with a larger spatial pitch (e.g. a smaller spatial frequency 'f2') than the initial control profile. In case of splitting the control profile into two components the spatial frequency 'f2' of the correction is then 'f1'/2 (half of 'f1'). In case a need for further reduction of required spatial frequency for control exists, further splitting into more than two control profile components associated with more than two distinct sub-field groups is proposed and in line with the spirit of the invention. For example a set of 4 reticles, each reticle comprising a specific group of dies associated with a specific layout of sub-fields may be used. This may be relevant in case the number of dies along the direction of scanning 1550 is very large (for example»7).

It can be observed that the individual (per exposure) control profile components 1615 and 1625 are selected such that they are continuous and as they each relate to a different group of sub-fields are less high frequent than a control profile would have to be in case it needs to provide correction of the performance parameter variation 1600 in just one exposure (e.g. for all sub-fields). The accomplished pitch relaxation and continuous behavior of the individual control profile components ensure better correctability of the performance parameter variation 1600 by the actuators (e.g. lens and stage control infrastructure) of the lithographic apparatus (tool).

Figure 17:
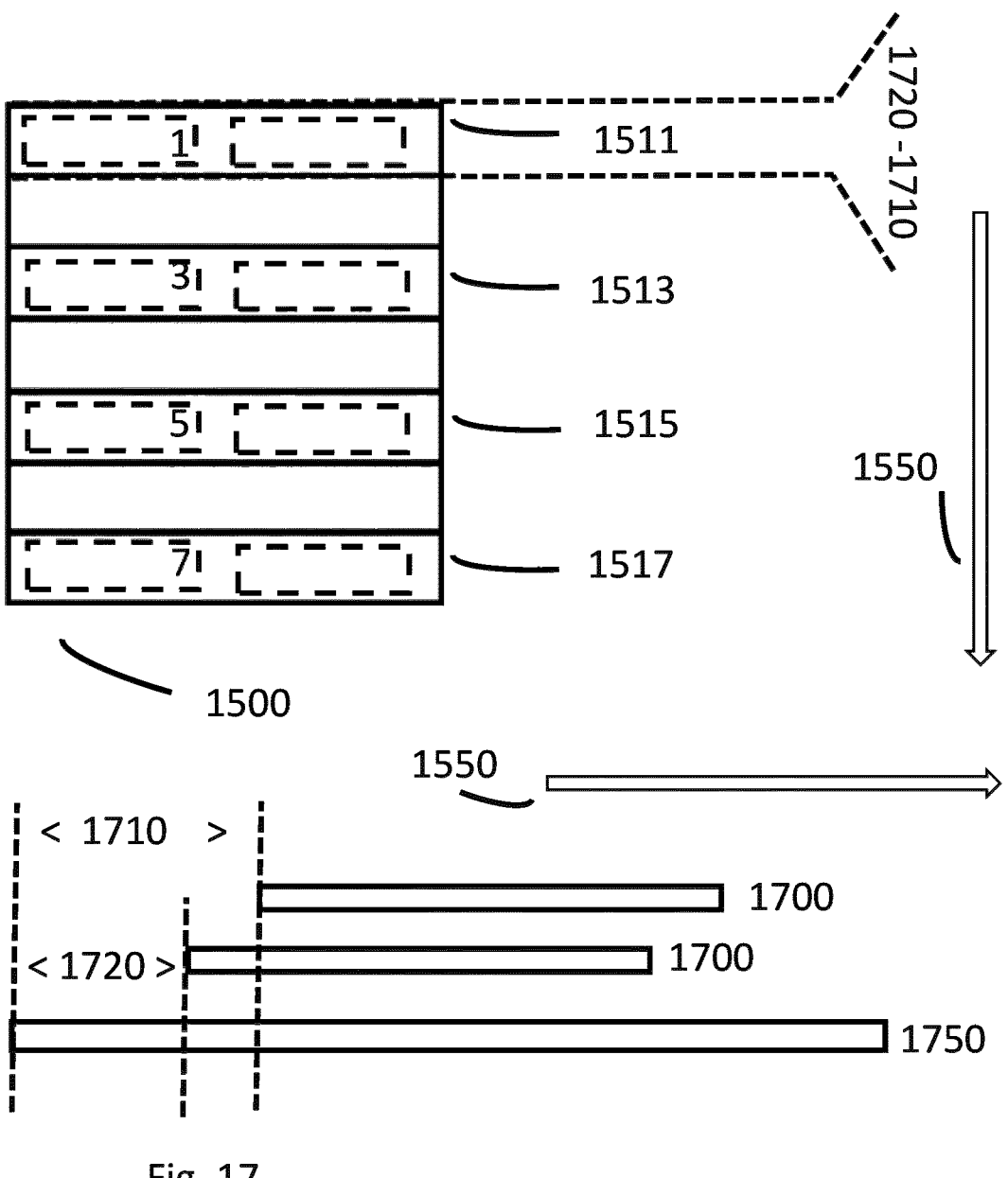
FIG. 17 depicts an embodiment of shifting a reticle in between two separate exposure steps.

In another implementation one group of dies are provided to one reticle, and the lithographic tool exposes the one reticle in a first exposure step, shifts the reticle or wafer stage by an amount such that the one group of dies are provided to the substrate in between the already provided dies in a second exposure step. The advantage is that only one reticle is needed, but this only is feasible in case the lithographic tool is provided with a wafer (substrate) or reticle stage which allows a large enough shift (e.g. corresponding at least to a length of a sub-field). This is depicted in FIG. 17. A reticle 1700 is positioned relative to the substrate 1750 in a first position 1710 at the onset of the first exposure step and at a second position 1720 at the onset of the second exposure step. The difference 1720-1710 corresponds in this particular case with a value identical or close to a dimension of a subfield 1511 along the direction of scanning 1550.

In another implementation only one reticle (comprising all dies as depicted in FIG. 15a) is provided comprising both odd and even numbered dies, but instead of switching or shifting the reticle (FIG. 17) in between exposures, the lithographic tool exposes first the odd numbered dies, by closing the reticle masking (REMA) blades for example when the evenly numbered dies are positioned within the illumination beam, and in a second exposure exposes the evenly numbered dies (again by using the REMA to prevent exposure of the undesired dies, in this case the oddly numbered dies).

To allow the exposure of a sub-set of sub-fields of the exposure field to be executed, the lithographic tool may be provided with a control interface configured to receive a layout of sub-fields to be exposed in one exposure step. The skipped sub-fields may then be associated with a closed REMA setting preventing exposure of sub-fields which are not selected.

In an embodiment a method is provided for controlling a lithographic process for exposing a pattern on an exposure field, the method comprising: obtaining an initial spatial profile associated with a spatial variation of a performance parameter across the exposure field; decomposing the initial spatial profile into at least a first component spatial profile for controlling the lithographic apparatus to correct the spatial variation of the performance parameter across a first plurality of sub-fields in a first exposure step and a second component spatial profile for controlling the lithographic apparatus to correct the spatial variation of the performance parameter across a second plurality of sub-fields in a second exposure step, wherein the controlling of the lithographic process using the first and second component spatial profiles during their corresponding exposure steps mitigates the spatial variation of the performance parameter across the exposure field.

In an embodiment the first plurality of sub-fields and the second plurality of sub-fields are associated with a layout of dies on a patterning device (reticle, mask).

In an embodiment the first plurality of sub-fields are associated with a first patterning device and the second plurality of sub-fields are associated with a second patterning device.

In an embodiment the first plurality of sub-fields and the second plurality of sub-fields are associated with a layout of dies on a patterning device (reticle, mask), wherein the second plurality of sub-fields are associated with a different position of the patterning device relative to a substrate used in the lithographic process than a position of the patterning device relative to the substrate associated with the first plurality of sub-fields.

In an embodiment the controlling of the lithographic process is controlling a stage and/or projection lens actuator used during the lithographic process.

In an embodiment the first plurality of sub-fields is associated with a first group of dies on a patterning device and the second plurality of sub-fields is associated with a second group of dies on the or another patterning device, wherein the relative position of the first group of dies with respect to the patterning device is interlaced with respect to the position of the second group of dies relative to the or another patterning device.

In an embodiment a lithographic tool is provided with a control interface configured to receive information associated with a definition of a sub-set of sub-fields comprised within an exposure field, said sub-set associated with sub-fields scheduled to be exposed by the lithographic tool in an exposure step.

The invention may be used to decompose an initial control profile (targeted to correct the spatial variation of a performance parameter across a plurality of sub-fields within a field) into multiple components. In this case the decomposition is based on splitting the correction into a first and second exposure step of patterning a layer associated with the performance parameter variation. The first and second exposure are associated with different groups of sub-fields, for example distributed across a plurality of reticles. The control profile components may further be co-optimized to provide a better correction of the observed spatial variation of the performance parameter across the sub-fields within the field of interest.

In an embodiment a method for control of a lithographic process for exposing a pattern on an exposure field is provided, the method comprising: obtaining an initial spatial profile associated with a spatial variation of a performance parameter for a first layer across a sub-field of the exposure field;

decomposing the initial spatial profile into at least a first component spatial profile usable for controlling a lithographic apparatus to correct the spatial variation of the performance parameter and a second component spatial profile usable for controlling the lithographic apparatus to correct the spatial variation of the performance parameter; and co-optimizing the first and second component spatial profiles to achieve a better correction of the spatial variation of the performance parameter in comparison to correction of the spatial variation of the performance parameter based on using the initial spatial profile for controlling the lithographic apparatus, wherein the first component spatial profile is associated with a first exposure to pattern the first layer and the second component spatial profile is associated with a second exposure to pattern the first layer.

In an embodiment the first component spatial profile is associated with a first reticle associated with the first exposure and the second spatial profile is associated with a second reticle associated with the second exposure.

In an embodiment the first exposure is associated with a first group of sub-fields or dies on a reticle and the second exposure is associated with a second group of sub-fields or dies on the reticle or another reticle.

In an embodiment the first and second reticle comprises first die areas associated with sub-fields for which no or a reduced control requirement applies and second die areas for which a control requirement applies.

In an embodiment the first die areas on the first reticle are associated with different sub-fields than the first die areas on the second reticle.

In summary, a method is proposed which divides a correction profile into a plurality of component correction profiles according to a co-optimization between tools, processes and/or layers which form part of an IC manufacturing process on a substrate.

Such a co-optimization will improve the ability to implement (actuate) a correction through a co-optimized control of the tools, processes and/or layers. The division of correction may be between processes such as between a reticle writing process and a scanner control process, for example.

It can be shown that such an approach will result in improved overlay and therefore yield. Furthermore, optimized reticle corrections can reduce the need for expensive updates of the reticle (less reticle correction is required due to the flexibility in the optimized scanner control). Extension in the range of overlay sub-field corrections increases flexibility of reticle intra-die fingerprint, and in turn will increase overlay correction potential further. It is possible to co-optimize the reticle writing fingerprint such that it is favorable for all key overlay optimizer parameters leading to improved on product performance in terms of one or more of EPE, imaging, CDU, overlay, focus, and levelling. It is further possible to split the scanner workload, so that only a fraction of the correction range needs addressing in any single layer, with the remaining fraction(s) addressed in one or more subsequent layers.

As previously described, and depicted in FIG. 4, overlay per sub-field/die exhibits a saw-tooth pattern requiring a corresponding saw-tooth correction. Between the dies or sub-fields, the required overlay correction is highly discontinuous, which is very challenging to actuate in scanner overlay control. Essentially, there is a very small amount of time and space available during the exposure to implement such a large overlay error correction (e.g., comprising a sign change).

A further proposal to address this issue will now be described. In this embodiment, it is proposed to determine an optimized reticle correction per sub-field, which is optimized over the field (e.g., in at least one direction) taking into account the scanner actuation capability. The optimization may be such that, after writing the reticle, the remaining overlay error profile to be corrected is better (e.g., more easily) correctable by the scanner control infrastructure compared to present reticle correction strategies.

FIG. 10A and FIG. 10B conceptually illustrate this embodiment. FIG. 10A illustrates a typical present strategy. The solid black lines 1000a, 1000b each illustrate a reticle correction profile for two adjacent sub-fields or dies of a field (which are largely similar in this example). The dotted/gray line 1010 illustrates the resultant required scanner correction profile (e.g., for a field exhibiting a saw tooth like pattern or similar) over the two sub-fields. It can be seen that this correction is discontinuous between the sub-fields, and therefore may be poorly correctable by control systems which are continuous by nature (such as stage control during scanning operation).

FIG. 10B illustrates improved reticle correction profiles over two adjacent fields. Such reticle correction profiles may be determined by co-optimizing the reticle correction profile for each sub-field over two or more sub-fields of a field; e.g., for all the sub-fields of a field in one or both directions parallel with the substrate/reticle planes. In FIG. 10B, the reticle correction profiles 1020a, 1020b are such that the required scanner correction profile 1030 is now simpler to actuate. For example, the second reticle profile 1020b results in an (e.g., overlay) error in its corresponding sub-field which can be corrected more easily by the scanner from its immediate state/configuration after correcting the preceding sub-field, where the preceding sub-field has been subject to reticle correction profile 1020a.

In a specific example such as illustrated here, the optimization over two adjacent sub-fields may result in at least one over-compensated reticle correction profile 1020b, which is substantially inverted compared to a nominal correction, such that the resultant residual overlay error profile tends to exhibit a smooth or smoother curve over the two sub-fields, which will be better actuatable within the scanner. Of course, this concept is extendable over more than two sub-fields.

While clearly relevant in terms of sub-fields/dies along the scanning (Y) direction, it should also be appreciated that this embodiment is also applicable along the slit (X) direction. Scanner correction capability in this direction is more limited (e.g., to lens corrections etc.) and as such, there may be additional benefit in performing this optimization in the X direction.

As has already been described, this reticle correction profile may be applied by determining a specific reticle writing correction for a reticle writing tool.

This embodiment may be combined with any of the aforementioned embodiments. For example, the reticle correction co-optimization over multiple sub-fields may also be co-optimized with the scanner control profile optimization (e.g., using the methods described in relation to FIG. 5). This may result in adjacent linear reticle correction profiles having mutually reverse slopes (corresponding to FIG. 5(a)) or reverse direction steps (corresponding to FIG. 5(b)) for example. Also, the reticle correction co-optimization over multiple sub-fields may also be decomposed over multiple layers (e.g., using the methods described in relation to FIG. 8).

In an embodiment a method for determining an overlay error correction is disclosed, the method comprising: obtaining an overlay error profile extending across a plurality of sub-fields; and determining a reticle correction across at least two adjacent sub-fields out of the plurality of sub-fields, characterized in that the reticle correction is based on an expected improvement of the continuity of the overlay error profile between said adjacent sub-fields. In an embodiment the reticle correction is configured to achieve continuity of the overlay error profile across said adjacent sub-fields by a substantial inversion and/or over correction of the overlay error profile.

Typically, after processing, a substrate (wafer) demonstrates a certain global overlay fingerprint across the wafer surface. This global fingerprint is often most pronounced at the periphery or edge area of the wafer. This global fingerprint is modelled by a suitable model and further controlled using "Advanced Process Control" (further also referenced to as APC) control methods which are typically run-to-run control solutions where a global overlay fingerprint observed in a first lot of wafers is used to correct processing (exposure) of subsequent lots of substrates. More information on APC can be found in U.S. Patent Application Publication No. US20120008127, which is incorporated herein by reference. A typical APC implementation involves periodic measurements on metrology features on the substrates to monitor and correct drifts associated with one or more processing apparatus. In run-to-run (often abbreviated as run2run) APC control, a fingerprint (e.g., an overlay fingerprint) is estimated from a set of substrates (e.g., wafers) measured per lot. One or more measured fields from these substrates are fit to a fingerprint, and then this fingerprint is typically mixed with earlier fingerprints to create a new fingerprint estimate using an exponentially weighted moving average (EWMA) filter. Alternatively, the fingerprint may simply be updated periodically, or even measured once and held constant. A combination of some or all of these approaches is also possible. The results of this calculation are then run through an optimization job in order to set one or more scanner actuators and/or other tool actuators/ settings for the next lot to reduce or minimize overlay.

In addition to the global APC overlay corrections, sub-field specific corrections may be defined based on higher density overlay data, as has already been described. For example, the saw-tooth shaped overlay error profile illustrated in FIG. 4 may require separate corrections per sub-field. This may involve one or more of: scanner corrections at sub-field level, reticle corrections at sub-field level, distribution of correction per sub-field across multiple layers of the process. Hence, there may be at least two active control infrastructures for overlay control on the same set of wafers (lot). A typically case where there is a risk of the two control regimes interfering is in control of edge-dies, which are subject to a large edge effect associated with the global fingerprint and a significant intra-die effect associated with the intra-die stress.

It is preferred that the two control systems (global or APC control loop and sub-field based control loop) do not interfere to such an extent that either over-correction or under-correction of the overlay error occurs (e.g., the two control loops work against each other). To avoid this, it is proposed in a further embodiment, that a global correction and a sub-field correction are each determined in co-optimization; e.g., being aware that either a global correction is applied or a sub-field correction is applied. Such an approach may be applied over a whole substrate, or optionally only for certain regions, such as for edge-fields or edge-dies.

Figures 11, 12A, 12B, 12C:
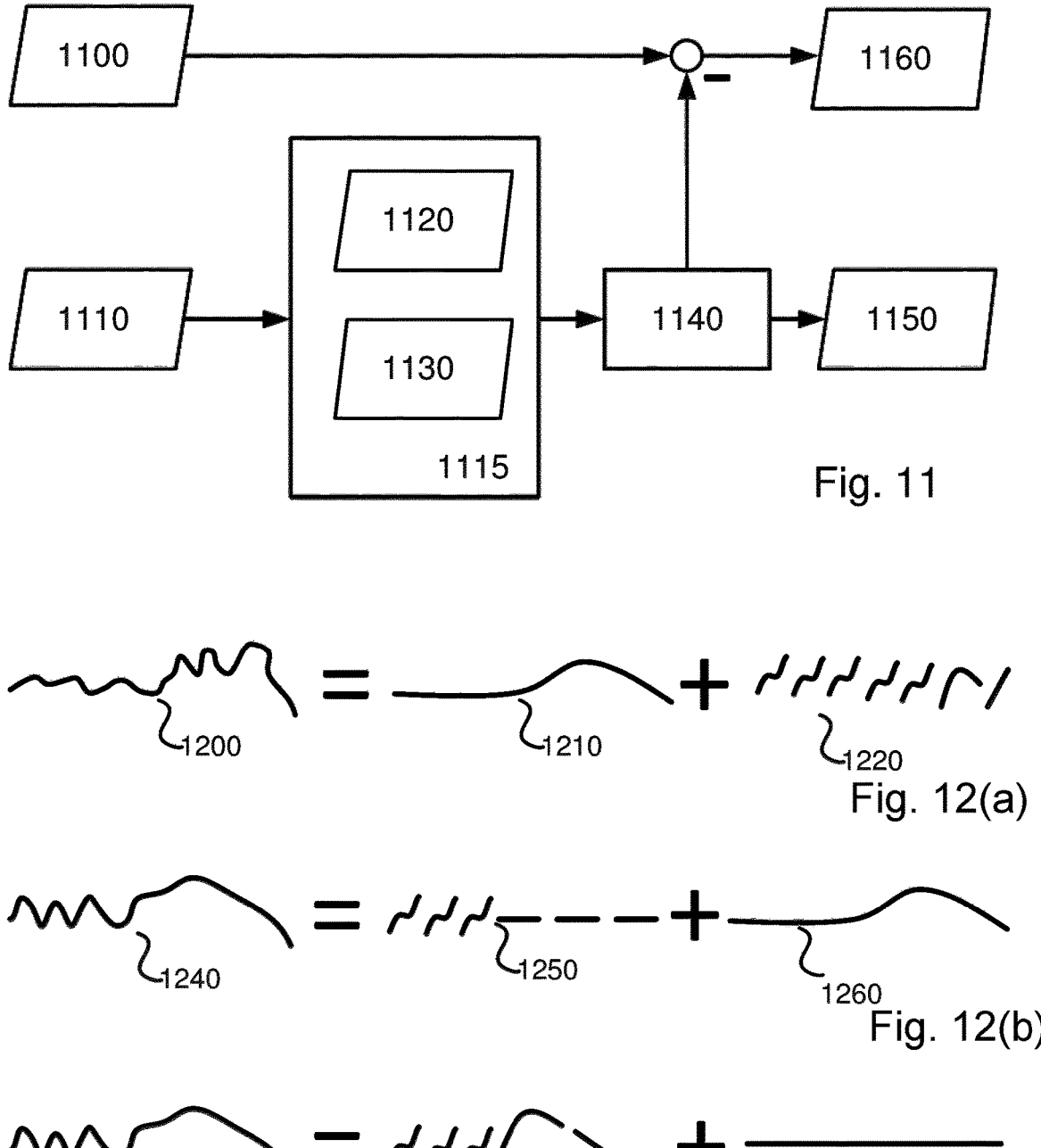
FIG. 11 is a flowchart depicting co-optimized global and sub-field control according to an embodiment of the invention.

FIG. 11 is a flowchart describing the principle behind this control method, according to an embodiment. Global (e.g., APC) measurement and/or correction data 1100 and sub-field (e.g., intra-die) measurement and/or correction data 1110 are received. The intra-die data is decomposed 1115 into sub-field component data 1120 and global component data 1130. The sub-field component data 1120 may describe this data in terms of the whole component or only its variation from the global component data 1130. The sub-field component data 1120 and global component data 1130 is used in a co-optimizing step 1140 which determines a preferred control strategy. This step may comprise determining an appropriate weighting of the global (e.g., APC) corrections with respect to the sub-field control; e.g., such that overlay error (residual) after co-optimized correction is minimized and/or in terms of an optimized strategy for dynamic and static correction. As a result, the co-optimizing step 1140 results in sub-field corrections 1150, and global corrections, the latter being subtracted from global correction data 1100 (so that they are not actuated twice) to obtain global (run-to-run) corrections 1160 (e.g., as part of an APC control loop).

FIG. 12(a) conceptually illustrates the decomposition step 1115 according to an embodiment. An across wafer fingerprint 1200 is decomposed into a global fingerprint 1210 (e.g., correctable by APC controller) and sub-field components 1220 (e.g., correctable by sub-field control infrastructure).

FIG. 12(b) conceptually illustrates an example overlay correction strategy based on fitting a global model before fitting of a residual on a sub-field basis. A global wafer fingerprint 1260 is obtained by extracting the intra-field (intra-die included) component 1250 from an across wafer fingerprint 1240. This clean global wafer fingerprint 1260 is used as an input for the APC control infra-structure, while the intra-field content 1250 is used for the sub-field control infra-structure. Alternatively, part of the edge fingerprint of the global overlay error fingerprint may be assigned to the sub-field control infrastructure which leaves less overlay error content to be corrected by the APC control infra-structure. This is illustrated in FIG. 12(c) where the sub-field control profiles 1270 show greater variation (across the wafer) due to the edge effects now included therein, which results in the global component 1280 being less varying.

As such, a method is disclosed for determining a co-optimized global and sub-field control strategy for a lithographic process, the method comprising a) obtaining global and intra-die measurement data, b) decomposing the intra-die measurement data into global component data and sub-field component data, c) using the global component data, sub-field component data and known scanner control characteristics to determine the co-optimized control strategy, and d) provide a global control input and a sub-field control input based on the co-optimized control strategy. The determination of the co-optimized control strategy may comprise determining an appropriate weighting of the global component data and sub-field component data or corrections therefor.

Figure 13:
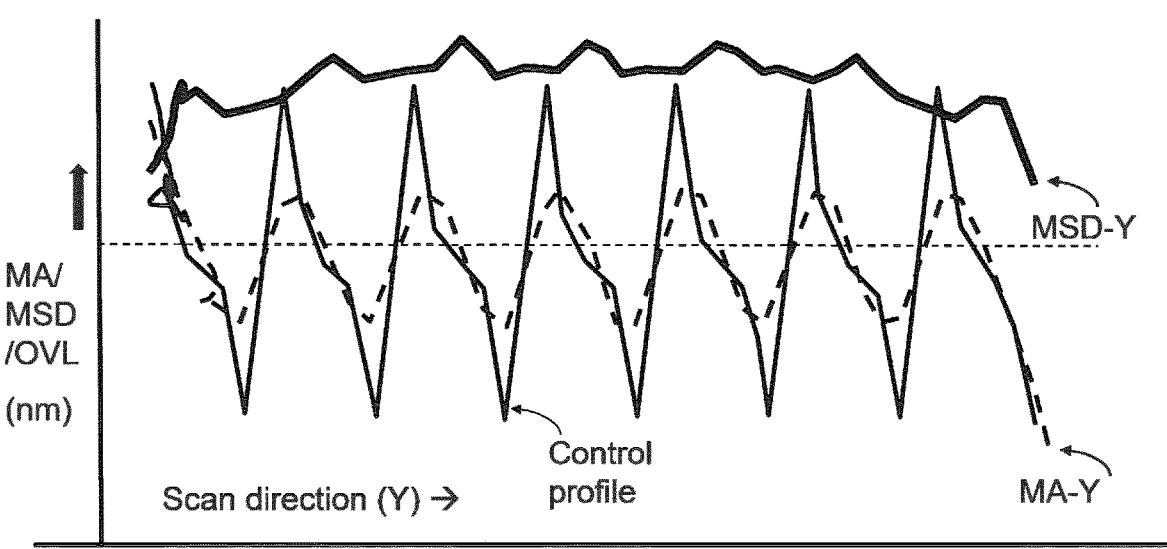
FIG. 13 illustrates an overlay control profile and its associated MSD (fading) and MA (overlay error)

As shown in FIG. 4 typically intra-die stress causes a pronounced saw-tooth profile of an overlay error along a direction of scanning. A control profile for the scanner to correct this overlay profile (repeating across the multiple dies within the exposure field) also reflects this typical saw-tooth shape. This is illustrated in FIG. 13 by the line showing a large amplitude control profile (typical applying a periodic synchronization signal between the reticle and the wafer stage). The remaining overlay error (MA=Moving Average) is illustrated by the small amplitude dashed graph (amplitude of around 2 nm). The dynamic error (MSD=Moving Standard Deviation) in the scan direction (Y-direction in our case) is illustrated by the small amplitude top (bold line) graph. The MSD is also often referred to as 'fading' and basically can be seen as a high frequent vibration between the reticle and the wafer stage having an effect of smearing out the aerial image of the projected pattern and causing contrast loss. This effect of reduction of contrast of the aerial image is often associated with a change in dimension of the feature (pattern) of interest. This change in dimension is direction specific (e.g. MSD-Y in the scan direction causing mainly changes of the dimension in a Y-direction) and typically the dimensional change is proportional with the magnitude of the MSD. Hence a MSD-Y variation across a field or die causes a dimensional variation, for example of a contact hole, across the die. In case of a 2-dimensional structure (like a contact hole) this manifests itself as a field coordinate dependent aspect ratio of X and Y dimensions of the 2-dimensional structure. In case of a contact hole the ratio between the X and Y dimension is typically referred to as the ellipticity of the contact hole. Hence the MSD-Y variation as depicted in FIG. 13, as a result of the strong intra-die overlay correction (control profile) will cause intra-die (and of course intra-field) contact hole ellipticity variations.

Figure 14:
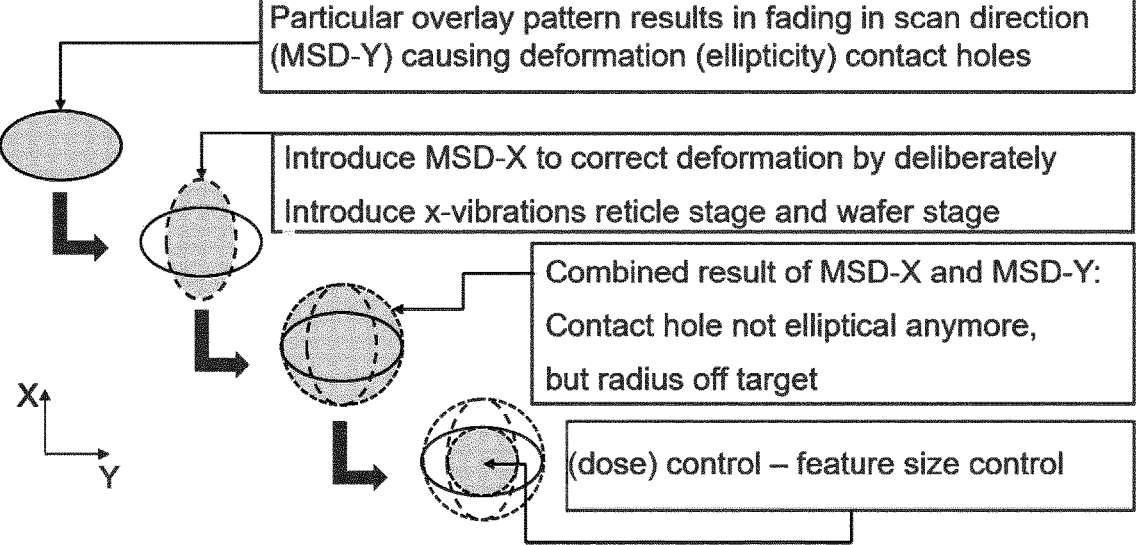
FIG. 14 demonstrates a method according to an embodiment to correct the effect of non-constant fading within an exposure field on pattern fidelity of a contact hole feature.

FIG. 14 illustrates a method according to the invention which is suitable to at least partially correct the intra-die contact hole deformation variation. First the MSD-Y profile is considered based on analysis of the required control profile (to correct the overlay error profile). Secondly the effect of the MSD-Y variation on the contact hole ellipticity variation is calculated (using a lithography simulation tool for example) or measured. Thirdly a MSD-X profile is designed such that the expected contact hole ellipticity is brought back to nominal. Basically MSD is introduced which has at least a component perpendicular to the scan direction such that the dimension of the contact hole in the X-direction is affected. This could be achieved for example by introducing a high frequent oscillation in the X-direction between the reticle and the wafer stage, having an amplitude depending on the field coordinate (e.g. tuning the amplitude such that the MSD-X level equals the scanning induced MSD-Y level). Alternatively the projection lens aberrations may be tuned by configuring lens manipulators causing a field dependent MSD-X component, for example by causing a field coordinate dependent pattern shift in the x-direction). The result is that the contact hole will not be elliptical anymore. However due to the presence of MSD-X and Y the radii of the contact holes may deviate from nominal causing a variation of the contact hole radius along the direction of scanning. In case this variation exceeds a certain tolerance a fourth step may be needed: apply a field coordinate dependent dose correction during scanning operation to keep the dimension of the contact holes at target. Alternatively the scan speed may be varied to tune the accumulated dose per field point or the z-position (position) may be dynamically adjusted to keep the contact hole radius at target.

Instead of compensating the pattern deformation variation along the scan direction using the lithographic apparatus control infrastructure (lens and/or stage synchronization) also the pattern device (reticle) may be configured to pre-correct the effect of fading on the pattern geometry fidelity. For example the reticle may comprise a plurality of dies oriented along the scan direction and comprising contact hole features. By pre-compensating the ellipticity variation of the contact holes on the reticle it is possible to obtain nominally shaped contact holes after exposure of the contact holes in the resist. The reticle then needs to be manufactured based on knowledge of the fading induced ellipticity variation (fingerprint) along the scan direction for all dies of interest. This can be achieved by altering the shape of the features (contact holes) on the reticle or method of OPC (e.g. placement of assist features in one or more directions). Further the size of the contact holes may be chosen as to control further the radius of the contact holes after exposing them to the photosensitive layer on the substrate (resist).

The control of the MSD-X is typically part of a sub-field type of controlling the lithographic apparatus as the MSD-X(t) control signal may be die specific.

Apart from the control aspects also metrology schemes may be generated based on known dynamics; e.g. based on a known variation of feature dimensions due to scanning induced fading (MSD-Y). FIG. 13 demonstrates that the MSD-Y level is highly dependent on the location within the die. Hence any control of fading induced dimensional variation would benefit from metrology data associated with locations along the scan direction where the MSD-Y amplitude is expected to be significant. In an embodiment it is proposed to provide CD (Critical Dimension) measurements at one or more locations where the scanning induced MSD causes a dimensional deviation larger than a threshold. The threshold may be associated with an accuracy of the metrology tool in determining CD values, for example the threshold may be 0.2 nm.

In an embodiment a method of configuring a process associated with manufacturing of semiconductor devices on a substrate is disclosed, the method comprising: determining an expected variation of a ratio between dimensions of a feature provided to the substrate using a patterning process; and configuring the patterning process and/or a patterning device used in the patterning process to at least partially correct the expected variation of the ratio across a region on the substrate.

The expected variation may be due to non-symmetric fading variation introduced by having for example only a MSD variation in one direction (due to either stage dynamics and/or asymmetry in lens aberration variation).

The ratio between dimensions may for example be an ellipticity of a contact hole or an aspect ratio of a geometry like a line or space.

Configuring of the patterning process may include adjustment of the stage synchronization (between Reticle Stage 'RS' and Wafer Stage 'WS') such that MSDx(t) is coupled to MSDy(t) and the vector [MSD-X(t), MSD-Y(t)] is always at the same angle with the X-axis.

Configuring of the patterning process may also involve application of a wavefront variation during scanning such that introduced Wavefront Asymmetry WA(t) counteracts the effect of MSDx/y(t) on the ratio between dimensions.

Configuring of the patterning process may further include dose and/or scan speed control targeted to bring feature dimensions back to target (e.g. avoid CD variation).

Configuring the patterning process may further involve stage control aspects, for example: provide a stage control profile (x(t),y(t),z(t)) meeting the following criteria: a) ratio variation (ellipticity contact hole) should be minimal and b) CD remains on target (scan slower when more dose needed to bring dimensions back to target) and c) configure z(t) to increase MSD-Z (contrast) term where no (or little) MSD-X/Y is introduced to get a constant contrast across the die and/or exposure field in addition to a constant dimensioning of exposed features.

Configuring of the patterning device may involve a field coordinate dependent ratio of feature dimensions counteracting an expected variation of the ratio due to patterning process limitations.

Configuring of the patterning device may involve a field coordinate dependent OPC configured to selectively deform feature such that after the patterning process no variation in ratio between dimensions exist.

Configuring of the patterning device may involve a field coordinate dependent reticle transmission to keep the CD of features provided to the wafer constant (in addition to MSD-X/Y balancing; so symmetry imposed by scanner control and CD offset corrected by reticle transmission tuning).

Alternatively for each die (sub-field) a control profile may be derived that provides a better balancing between fading induced fading (MSD-Y) CD variation and overlay variation. The control profile as depicted in FIG. 13 is then optimized per subfield to provide the smallest possible EPE, the EPE being an aggregated metric comprising both overlay and CD variation effects. It is proposed to configure the control profile such that the resultant CD variation due to the fading component and the resultant overlay residual error (MA component) give the smallest EPE error for a feature of interest.

In another embodiment a method of determining a sampling scheme associated with an exposure field on a substrate subject to a patterning process is disclosed, the method comprising: deriving an expected distribution of a pattern dimensioning error and/or a pattern positioning error across the exposure field due to a time dependency of a synchronization error between movement of a patterning device and the substrate during the patterning process; and determining the sampling scheme based on a desired accuracy of characterizing the expected distribution using measurements of the pattern dimensions and/or pattern positions according to the sampling scheme.

Further embodiments of the invention are disclosed in the list of numbered clauses below:

1. A method for determining component spatial profiles for control of a lithographic process for exposing a pattern on an exposure field, the method comprising:
   obtaining an initial spatial profile describing spatial variation of a performance parameter for a first layer across at least a sub-field of the exposure field; and
   decomposing the initial spatial profile into component spatial profiles relating to the sub-field, said component spatial profiles comprising at least a first component spatial profile and a second component spatial profile; and
   co-optimizing the component spatial profiles to minimize error in the performance parameter;
   wherein at least said first component spatial profile is usable by a lithographic apparatus to control the lithographic process in exposing a pattern on said exposure field in the first layer; and
   said first component spatial profile can be more accurately actuated by the lithographic apparatus in comparison to the initial spatial profile.

2. A method according to clause 1, wherein the performance parameter comprises or relates to overlay of the first layer with respect to one or more other layers.

3. A method according to clause 1 or 2, wherein the performance parameter comprises edge placement error.

4. A method according to any preceding clause, wherein said first component spatial profile is limited to values with a range smaller than the total range of said initial spatial profile.

5. A method according to any preceding clause, wherein said first component spatial profile is optimized to be actuable by the lithographic apparatus.

6 A method according to any preceding clause, wherein said first component spatial profile is used in control of one or both of stage positioning control within the lithographic apparatus or projection lens control within the lithographic apparatus.

7. A method according to any preceding clause, wherein said second component spatial profile relates to a reticle correction for a reticle used in the lithographic process for exposing the pattern in the first layer.

8. A method according to clause 7, wherein said second component spatial profile is used in control of manufacturing and/or modification of the reticle.

9. A method according to clause 7 or 8, wherein said second component spatial profile is used in control of the relative positioning of features on the reticle.

10. A method according to any of clauses 7 to 9, wherein the second component spatial profile is of a lower order than said first component spatial profile.

11. A method according to any of clauses 7 to 10, wherein said second component spatial profile is linear or a step profile.

12. A method according to any of clauses 7 to 11, wherein said decomposing step further comprises decomposing the initial spatial profile into layer component spatial profiles so as to distribute control based on said initial spatial profile over a plurality of layers, said plurality of layers comprising said first layer.

13. A method according to any of clauses 7 to 11, comprising decomposing at least one of said component spatial profiles into layer component spatial profiles, each for control of said lithographic process for a specific one of a plurality of layers, said plurality of layers comprising said first layer, so as to distribute control based on the at least one of said component spatial profiles over a plurality of layers.

14. A method according to clause 11, wherein the at least one of said component spatial profiles decomposed into layer component spatial profiles comprises the first component spatial profile.

15. A method according to any of clauses 1 to 6, wherein said decomposing step comprises decomposing the initial spatial profile into said component spatial profiles so as to distribute control based on said initial spatial profile over a plurality of layers, said plurality of layers comprising said first layer, and
   wherein said second component spatial profile is usable by a lithographic apparatus to control the lithographic process in exposing a pattern on said exposure field in a second layer, and wherein said second component spatial profile can be more accurately actuated by the lithographic apparatus in comparison to the initial spatial profile.

16. A method according to any of clauses 7 to 15, comprising using multi focus imaging when performing the lithographic process; and optimizing the illumination settings during said exposing of a pattern based on a maximum allowed moving standard deviation associated with the initial spatial profile and/or appropriate component spatial profile.

17. A method according to clause 16, wherein said maximum allowed moving standard deviation is determined and said illumination settings are optimized per layer.

18. A method according to any preceding clause, comprising devising a merit function which describes the performance parameter in terms of at least one or more first correction terms relating to the first component spatial profile and one or more second correction terms relating to the second component spatial profile; and iteratively solving the merit function to determine said first component spatial profile and said second component spatial profile.

20. A method according to any of clauses 1 to 17, wherein said initial spatial profile is decomposed into a plurality of candidate first component spatial profiles and candidate second component spatial profiles; and said method comprises determining an optimal combination of first component spatial profile and candidate second component spatial profile according to the performance metric.

21. A method according to any preceding clause, wherein said co-optimizing step comprises optimization of moving average, moving standard deviation or a combination of moving average and moving standard deviation associated with the initial spatial profile.

22. A method according to clause 21, wherein said optimization of moving average, moving standard deviation or a combination of moving average and moving standard deviation is determined with respect to minimizing error in one or more features identified as having a small process window.

23. A method according to any preceding clause, wherein said initial spatial profile is derived from a known intra-die stress fingerprint.

24. A method according to any preceding clause, wherein said first component spatial profile is of a third order or higher.

25. A method according to any preceding clause, comprising performing said lithographic process based on said component spatial profiles.

26. A method according to any preceding clause, wherein each sub-field relates to a single die or functional area thereof.

27. A method according to any preceding clause, wherein said method is performed to determine respective sets of said component spatial profiles for each sub-field of the exposure field.

28. A computer program comprising program instructions operable to perform the method of any of clauses 1 to 27 when run on a suitable apparatus.

29. A non-transient computer program carrier comprising the computer program of clause 28.

30. A lithographic apparatus operable to perform the method of any of clauses 1 to 27.

31. A method for determining an overlay correction profile associated with a sub-field within an exposure field, the method comprising:
   obtaining an overlay error profile between a first and a second layer across at least the sub-field; and
   determining a first overlay correction profile for manufacturing or modification of a reticle used in patterning the first layer and a second overlay correction profile for a lithographic apparatus used in patterning the first layer.

32. A method for determining an overlay correction profile, the method comprising:
   obtaining an overlay error profile between a first layer and a second layer across a sub-field within an exposure field;
   determining a first overlay correction profile for the first layer and a second overlay correction profile for the second layer, wherein the first and second correction profile sum up to mitigate the overlay error profile across the sub-field and are co-optimized to achieve a desired imaging quality across both the first layer and the second layer.

33. A method for determining an overlay error correction, the method comprising:
   obtaining an overlay error profile extending across a plurality of sub-fields along a direction of scanning; and
   determining a reticle correction across at least two adjacent sub-fields out of the plurality of sub-fields, characterized in that the reticle correction is based on an expected improvement of the continuity of the overlay error profile between said adjacent sub-fields.

34. A method to provide APC control input for an APC controller and sub-field control input for a lithographic apparatus, the method comprising:
   a) obtaining a fingerprint of a parameter measured across a substrate;
   b) decomposing the fingerprint into a global component and a sub-field component;
   c) using the global component and the sub-field component and control characteristics of the lithographic apparatus to determine a co-optimized control strategy; and
   d) determining the APC control input and sub-field control input based on the co-optimized control strategy.

35. A method for control of a lithographic process for exposing a pattern on an exposure field, the method comprising:
   obtaining an initial spatial profile associated with a spatial variation of a performance parameter for a first layer across a sub-field of the exposure field;
   decomposing the initial spatial profile into at least a first component spatial profile usable for controlling a lithographic apparatus to correct the spatial variation of the performance parameter and a second component spatial profile usable for controlling the lithographic apparatus or another apparatus to correct the spatial variation of the performance parameter; and
   co-optimizing the first and second component spatial profiles to achieve a better correction of the spatial variation of the performance parameter in comparison to correction of the spatial variation of the performance parameter based on using the initial spatial profile for controlling the lithographic apparatus.

36. A method for determining an overlay error correction, the method comprising:
   obtaining an overlay error profile extending across a plurality of sub-fields; and
   determining a reticle correction across at least two adjacent sub-fields out of the plurality of sub-fields; characterized in that:
   the reticle correction is based on an expected improvement of the continuity of the overlay error profile between said adjacent sub-fields.

37. A method according to clause 36, wherein the reticle correction is configured to achieve continuity of the overlay error profile across said adjacent sub-fields by a substantial inversion and/or over correction of at least a portion of said overlay error profile.

38. A method according to clause 36 or 37, wherein the reticle correction is determined for at least two adjacent fields in a scan direction and/or in a slit direction.

39. A method for determining a co-optimized global and sub-field control strategy for a lithographic process; comprising:
   a) obtaining global measurement data and intra-die measurement data;
   b) decomposing the intra-die measurement data into global component data and sub-field component data;
   c) using the global component data, sub-field component data and known scanner control characteristics to determine the co-optimized control strategy; and
   d) providing a global control input and a sub-field control input based on the co-optimized control strategy.

40. A method according to clause 39, wherein said sub-field component data is described in terms of variation from its corresponding global component data.

41. A method according to clause 39 or 40, wherein step c) comprises determining an appropriate relative weighting of the global component data and sub-field component data, and/or of corrections therefor.

42. A method according to clause 39, 40 or 41 wherein at least part of an edge fingerprint of the global measurement data is assigned to be corrected via the sub-field control input.

43. A method of configuring a process associated with manufacturing of semiconductor devices on a substrate, the method comprising:
   determining an expected variation of a ratio between dimensions of a feature provided to the substrate using a patterning process; and
   configuring the patterning process and/or a patterning device used in the patterning process to at least partially correct the expected variation of the ratio across a region on the substrate, wherein the configuring comprises one or more of: balancing of position control of the substrate along a scanning direction and a non-scanning direction, balancing of aberrations of a projection lens used in the patterning process and balancing of dimensions of structures along a first and a second direction.

44. A method of determining a sampling scheme associated with an exposure field on a substrate subject to a patterning process, the method comprising:
   deriving an expected distribution of a pattern dimensioning error and/or a pattern positioning error across the exposure field due to a time dependency of a synchronization error between movement of a patterning device and the substrate during the patterning process; and
   determining the sampling scheme based on a desired accuracy of characterizing the expected distribution using measurements of the pattern dimensions and/or pattern positions according to the sampling scheme.

45. A method for controlling a lithographic apparatus configured to pattern an exposure field on a substrate comprising at least a sub-field, the method comprising:
   obtaining an initial spatial profile associated with a spatial variation of a performance parameter associated with a first layer on the substrate across at least the sub-field of the exposure field; and decomposing the initial spatial profile into at least a first component spatial profile for controlling a lithographic apparatus at a first spatial scale and a second component spatial profile for controlling the lithographic apparatus at a second spatial scale associated with a size of the sub-field, wherein the decomposing comprises co-optimizing the first and second component spatial profiles based on correcting the spatial variation of the performance parameter across the sub-field.

46. The method of clause 45, wherein the co-optimizing is further based on an imaging quality metric.

47. The method of clause 45 or 46, wherein:
   said obtaining an initial spatial profile step comprises obtaining intra-die measurement data and global measurement data, said intra-die measurement data comprising at least said initial spatial profile;
   said decomposing step comprises decomposing the intra-die measurement data into said first component spatial profile comprising a global component and said second component spatial profile comprising a sub-field component; and
   said co-optimizing step comprises using the global component, sub-field component and known lithographic apparatus control characteristics.

48. The method of clause 47, further comprising providing a global control input and a sub-field control input to the lithographic apparatus based on the co-optimized global component and sub-field component.

49. The method of any of clauses 45 to 48, wherein the performance parameter comprises or relates to overlay of the first layer with respect to one or more other layers.

50 The method of any of clauses 45 to 49, wherein the performance parameter comprises edge placement error.

51. The method of any of clauses 45 to 50, wherein said first component spatial profile is limited to values with a range smaller than a range of values comprised within said initial spatial profile.

52. The method of any of clauses 45 to 51, wherein the co-optimizing is further based on bringing said first component spatial profile to be within an actuable range of the lithographic apparatus.

53. A method according to any of clauses 45 to 52, further comprising obtaining a merit function describing the correction of the performance parameter in terms of at least one or more first correction terms relating to the first component spatial profile and one or more second correction terms relating to the second component spatial profile, and wherein the co-optimizing is based on iteratively solving the merit function to determine said first component spatial profile and said second component spatial profile.

54. The method of any of clauses 45 to 53, wherein said co-optimizing is further based on optimization of moving average, moving standard deviation or a combination of moving average and moving standard deviation associated with the initial spatial profile.

55. The method of any of clauses 45 to 54, wherein said initial spatial profile is derived from a known intra-die stress fingerprint.

56. The method of any of clauses 45 to 55, wherein the sub-field relates to a single die or functional area thereof.

57 The method of any of clauses 45 to 56, wherein said first component spatial profile is used in control of one or both of stage positioning control within the lithographic apparatus or projection lens control within the lithographic apparatus.

58. A computer program comprising program instructions operable to perform the method of any of clauses 45 to 57 when run on a suitable apparatus.

59. A non-transient computer program carrier comprising the computer program of clause 58.

60. The method of clause 35, wherein the first component spatial profile is associated with a first exposure to pattern the first layer and the second component spatial profile is associated with a second exposure to pattern the first layer.

61. The method of clause 60, wherein the first component spatial profile is associated with a first reticle associated with the first exposure and the second spatial profile is associated with a second reticle associated with the second exposure.

62. The method of clause 60, wherein the first exposure is associated with a first group of sub-fields or dies on a reticle and the second exposure is associated with a second group of sub-fields or dies on the reticle or another reticle.

63. The method of clause 61, wherein the first and second reticle comprises first die areas associated with sub-fields for which no or a reduced control requirement applies and second die areas for which a control requirement applies.

64. The method of clause 63, wherein the first die areas on the first reticle are associated with different sub-fields than the first die areas on the second reticle.

65. A method for controlling a lithographic process for exposing a pattern on an exposure field, the method comprising: obtaining an initial spatial profile associated with a spatial variation of a performance parameter across the exposure field; decomposing the initial spatial profile into at least a first component spatial profile for controlling the lithographic apparatus to correct the spatial variation of the performance parameter across a first plurality of sub-fields in a first exposure step and a second component spatial profile for controlling the lithographic apparatus to correct the spatial variation of the performance parameter across a second plurality of sub-fields in a second exposure step, wherein the controlling of the lithographic process using the first and second component spatial profiles during their corresponding exposure steps mitigates the spatial variation of the performance parameter across the exposure field.

66. The method of clause 65, wherein the first plurality of sub-fields and the second plurality of sub-fields are associated with a layout of dies on a patterning device, such as a reticle or a mask.

67. The method of clause 65 or 66, wherein the first plurality of sub-fields are associated with a first patterning device and the second plurality of sub-fields are associated with a second patterning device.

68. The method of clause 65 or 66, wherein the first plurality of sub-fields and the second plurality of sub-fields are associated with a layout of dies on a patterning device, wherein the second plurality of sub-fields are associated with a different position of the patterning device relative to a substrate used in the lithographic process than a position of the patterning device relative to the substrate associated with the first plurality of sub-fields.

69. The method of any of clauses 65 to 68, wherein the controlling of the lithographic process is controlling a stage and/or projection lens actuator of a lithographic apparatus used during the lithographic process.

70. The method of clause 65 or 66, wherein the first plurality of sub-fields is associated with a first group of dies on a patterning device and the second plurality of sub-fields is associated with a second group of dies on the or another patterning device, wherein the relative position of the first group of dies with respect to the patterning device is interlaced with respect to the position of the second group of dies relative to the or another patterning device.

71. A lithographic tool comprising a control interface, wherein the control interface is configured to receive information associated with a definition of a sub-set of sub-fields comprised within an exposure field, said sub-set associated with sub-fields scheduled to be exposed by the lithographic tool in an exposure step.

Although patterning devices in the form of a physical reticle have been described, the term "patterning device" in this application also includes a data product conveying a pattern in digital form, for example to be used in conjunction with a programmable patterning device.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method comprising:

obtaining an error profile between a first layer and a second layer across a sub-field within an exposure field; and determining, by a hardware computer system, a first correction profile for the first layer and a second correction profile for the second layer, wherein the first and second correction profiles sum up to mitigate the error profile across the sub-field and are co-optimized to achieve a desired imaging quality across both the first layer and the second layer.

2. The method of claim 1, wherein the error profile comprises an overlay error profile.

3. The method of claim 1, further comprising a correction profile for adjustment of a patterning device used in exposure of the first and/or second layer.

4. The method of claim 1, wherein the determining evaluates a characteristic of movement of a substrate to which the first and second layers are being applied.

5. The method of claim 1, wherein the determining involves optimization of one or more radiation conditions.

6. The method of claim 4, wherein the optimization involves a multiple focus level optimization.

7. A computer program product comprising a non-transitory computer-readable medium comprising program instructions stored therein, the instructions, upon execution by a computer system, configured to cause the computer system to at least:

obtain an error profile between a first layer and a second layer across a sub-field within an exposure field; and determine a first correction profile for the first layer and a second correction profile for the second layer, wherein the first and second correction profiles sum up to mitigate the error profile across the sub-field and are co-optimized to achieve a desired imaging quality across both the first layer and the second layer.

8. The computer program product of claim 7, wherein the error profile comprises an overlay error profile.

9. The computer program product of claim 7, further comprising a correction profile for adjustment of a patterning device used in exposure of the first and/or second layer.

10. The computer program product of claim 7, wherein the instructions configured to cause the computer system to determine the first correction profile and the second correction profile are further configured to cause the computer system to determine the first correction profile and the second correction profile by evaluation of a characteristic of movement of a substrate to which the first and second layers are being applied.

11. The computer program product of claim 7, wherein the instructions configured to cause the computer system to determine the first and second correction profiles are further configured to cause the computer system to determine the first and second correction profiles through optimization of one or more radiation conditions.

12. The computer program product of claim 11, wherein the optimization involves a multiple focus level optimization.

* * * * *